US007388803B2

(12) United States Patent
Kodaira et al.

(10) Patent No.: US 7,388,803 B2

(45) Date of Patent: Jun. 17, 2008

(54) INTEGRATED CIRCUIT DEVICE AND ELECTRONIC INSTRUMENT

(75) Inventors: Satoru Kodaira, Chino (JP); Noboru Itomi, Nirasaki (JP); Shuji Kawaguchi, Suwa (JP); Takashi Kumagai, Chino (JP); Junichi Karasawa, Tatsuno-machi (JP); Satoru Ito, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 194 days.

(21) Appl. No.: 11/270,547

(22) Filed: Nov. 10, 2005

(65) Prior Publication Data

US 2007/0002669 A1 Jan. 4, 2007

(30) Foreign Application Priority Data

Jun. 30, 2005 (JP) ............................ 2005-193017

(51) Int. Cl.
*G11C 8/00* (2006.01)
*G09G 5/00* (2006.01)

(52) U.S. Cl. .................................. 365/230.06; 345/204

(58) Field of Classification Search ............ 365/230.06, 365/189.05; 345/204

See application file for complete search history.

(56) References Cited

U.S. PATENT DOCUMENTS

| | | | |
|---|---|---|---|
| 5,426,603 A | 6/1995 | Nakamura et al. | |
| 5,490,114 A * | 2/1996 | Butler et al. | 365/189.05 |
| 5,659,514 A | 8/1997 | Hazani | |
| 5,739,803 A | 4/1998 | Neugebauer | |
| 5,920,885 A | 7/1999 | Rao | |
| 6,025,822 A | 2/2000 | Motegi et al. | |
| 6,229,753 B1 | 5/2001 | Kono et al. | |
| 6,246,386 B1 | 6/2001 | Perner | |
| 6,324,088 B1 | 11/2001 | Keeth et al. | |
| 6,421,286 B1 | 7/2002 | Ohtani et al. | |
| 6,580,631 B1 | 6/2003 | Keeth et al. | |
| 6,646,283 B1 | 11/2003 | Akimoto et al. | |
| 6,724,378 B2 * | 4/2004 | Tamura et al. | 345/204 |
| 6,731,538 B2 | 5/2004 | Noda et al. | |
| 6,826,116 B2 | 11/2004 | Noda et al. | |
| 6,862,247 B2 | 3/2005 | Yamazaki | |
| 6,873,310 B2 | 3/2005 | Matsueda | |
| 6,999,353 B2 | 2/2006 | Noda et al. | |
| 7,078,948 B2 | 7/2006 | Dosho | |

(Continued)

FOREIGN PATENT DOCUMENTS

JP A 11-261011 9/1999

(Continued)

*Primary Examiner*—Anh Phung
(74) *Attorney, Agent, or Firm*—Oliff & Berridge, PLC

(57) ABSTRACT

An integrated circuit device includes: a RAM block including a plurality of wordlines, a plurality of bitlines, a plurality of memory cells, and a wordline control circuit; and a data line driver block which drives a plurality of data line groups of a display panel based on data supplied from the RAM block. The data line driver block includes first to Nth (N is an integer larger than one) divided data line driver blocks, each of the first to Nth divided data line driver blocks driving a different data line group of the data line groups. The wordline control circuit drives an identical wordline N times from among the wordlines in one horizontal scan period of the display panel. The first to Nth divided data line drivers are disposed along a first direction in which the bitlines extend.

26 Claims, 28 Drawing Sheets

U.S. PATENT DOCUMENTS

| | | | |
|---|---|---|---|
| 7,142,221 | B2 | 11/2006 | Sakamaki et al. |
| 7,158,439 | B2 | 1/2007 | Shionoiri et al. |
| 7,164,415 | B2 * | 1/2007 | Ooishi et al. ................ 345/204 |
| 7,176,864 | B2 | 2/2007 | Moriyama et al. |
| 7,180,495 | B1 | 2/2007 | Matsueda |
| 7,280,329 | B2 | 10/2007 | Kim et al. |
| 2002/0011998 | A1 | 1/2002 | Tamura |
| 2002/0018058 | A1 | 2/2002 | Tamura |
| 2004/0021947 | A1 | 2/2004 | Schofield et al. |
| 2004/0239606 | A1 | 12/2004 | Ota |
| 2005/0001846 | A1 | 1/2005 | Shiono |
| 2005/0047266 | A1 | 3/2005 | Shionori et al. |
| 2005/0057581 | A1 | 3/2005 | Horiuchi et al. |
| 2005/0212788 | A1 | 9/2005 | Fukuda et al. |
| 2005/0253976 | A1 | 11/2005 | Sekiguchi et al. |
| 2007/0000971 | A1 | 1/2007 | Kumagai et al. |
| 2007/0001886 | A1 | 1/2007 | Ito et al. |
| 2007/0001968 | A1 | 1/2007 | Kodaira et al. |
| 2007/0001969 | A1 | 1/2007 | Kodaira et al. |
| 2007/0001970 | A1 | 1/2007 | Kodaira et al. |
| 2007/0001971 | A1 | 1/2007 | Kumagai et al. |
| 2007/0001972 | A1 | 1/2007 | Kumagai et al. |
| 2007/0001973 | A1 | 1/2007 | Kumagai et al. |
| 2007/0001974 | A1 | 1/2007 | Kumagai et al. |
| 2007/0001975 | A1 | 1/2007 | Kumagai et al. |
| 2007/0001982 | A1 | 1/2007 | Ito et al. |
| 2007/0001983 | A1 | 1/2007 | Ito et al. |
| 2007/0001984 | A1 | 1/2007 | Kumagai et al. |
| 2007/0002061 | A1 | 1/2007 | Kumagai et al. |
| 2007/0002062 | A1 | 1/2007 | Kodaira et al. |
| 2007/0002063 | A1 | 1/2007 | Kumagai et al. |
| 2007/0002188 | A1 | 1/2007 | Kumagai et al. |
| 2007/0002509 | A1 | 1/2007 | Kumagai et al. |
| 2007/0002667 | A1 | 1/2007 | Kodaira et al. |
| 2007/0002670 | A1 | 1/2007 | Kodaira et al. |
| 2007/0002671 | A1 | 1/2007 | Kumagai et al. |
| 2007/0013074 | A1 | 1/2007 | Kodaira et al. |
| 2007/0013634 | A1 | 1/2007 | Saiki et al. |
| 2007/0013635 | A1 | 1/2007 | Ito et al. |
| 2007/0013684 | A1 | 1/2007 | Kodaira et al. |
| 2007/0013685 | A1 | 1/2007 | Kodaira et al. |
| 2007/0013687 | A1 | 1/2007 | Kodaira et al. |
| 2007/0013706 | A1 | 1/2007 | Kodaira et al. |
| 2007/0013707 | A1 | 1/2007 | Kodaira et al. |
| 2007/0016700 | A1 | 1/2007 | Kodaira et al. |

FOREIGN PATENT DOCUMENTS

| | | |
|---|---|---|
| JP | A-2001-067868 | 3/2001 |
| JP | A 2001-222249 | 8/2001 |
| JP | A 2001-222276 | 8/2001 |
| JP | A-2002-358777 | 12/2002 |
| JP | A 2004-146806 | 5/2004 |
| JP | A 2004-328456 | 11/2004 |
| JP | A-2005-17725 | 1/2005 |
| JP | A 2005-72607 | 3/2005 |
| KR | 10-2005-11743 | 1/2005 |

* cited by examiner

| | | | |
|---|---|---|---|
| CPU ACCESS | R0≠/R0 | A-SIDE | R0=L, /R0=H |
| | | B-SIDE | R0=H, /R0=L |
| LCD OUTPUT | R0=/R0=H | | |

INTEGRATED CIRCUIT DEVICE AND ELECTRONIC INSTRUMENT

Japanese Patent Application No. 2005-193017, filed on Jun. 30, 2005, is hereby incorporated by reference in its entirety.

BACKGROUND OF THE INVENTION

The present invention relates to an integrated circuit device and an electronic instrument.

In recent years, an increase in resolution of a display panel provided in an electronic instrument has been demanded accompanying a widespread use of electronic instruments. Therefore, a driver circuit which drives a display panel is required to have high performance. However, since many types of circuits are necessary for a high-performance driver circuit, the circuit scale and the circuit complexity tend to be increased in proportion to an increase in resolution of a display panel. Therefore, since it is difficult to reduce the chip area of the driver circuit while maintaining the high performance or providing an additional function, manufacturing cost cannot be reduced.

A high-resolution display panel is also provided in a small electronic instrument, and high performance is demanded for its driver circuit. However, since a small electronic instrument is limited in space, the circuit scale cannot be increased to a large extent. Therefore, since it is difficult to reduce the chip area while providing high performance, a reduction in manufacturing cost or provision of an additional function is difficult.

The invention disclosed in JP-A-2001-222276 cannot solve the above-described problems.

SUMMARY

A first aspect of the invention relates to an integrated circuit device, comprising:

a RAM block including a plurality of wordlines, a plurality of bitlines, a plurality of memory cells, and a wordline control circuit; and a data line driver block which drives a plurality of data line groups of a display panel based on data supplied from the RAM block, wherein the data line driver block includes first to Nth (N is an integer larger than one) divided data line driver blocks, each of the first to Nth divided data line driver blocks driving a different data line group of the data line groups, wherein the wordline control circuit drives an identical wordline N times from among the wordlines in one horizontal scan period of the display panel, and wherein the first to Nth divided data line drivers are disposed along a first direction in which the bitlines extend.

A second aspect of the invention relates to an integrated circuit device, comprising:

a RAM block including a plurality of wordlines, a plurality of bitlines, a plurality of memory cells, and a wordline control circuit; and a data line driver block which drives a plurality of data line groups of a display panel based on data supplied from the RAM block, wherein the data line driver block includes first to Nth (N is an integer larger than one) divided data line driver blocks, each of the first to Nth divided data line driver blocks driving a different data line group of the data line groups, wherein the wordline control circuit controls (L×J=N) times of reading of data from the RAM block in one horizontal scan period of the display panel, by selecting an identical wordline L times (L is an integer larger than one) and J wordlines (J is an integer larger than one) as the identical wordline selected L times in the one horizontal scan period, and wherein the first to Nth divided data line drivers are disposed along a first direction in which the bitlines extend.

A third aspect of the invention relates to an integrated circuit device, comprising:

a RAM block including a plurality of wordlines, a plurality of bitlines, a plurality of memory cells, and a wordline control circuit; and a data line driver block which drives a plurality of data line groups of a display panel based on data supplied from the RAM block, wherein the data line driver block includes first to Nth (N is an integer larger than one) divided data line driver blocks, each of the first to Nth divided data line driver blocks driving a different data line group of the data line groups, wherein the wordline control circuit sequentially selects N (N is an integer larger than one) different wordlines in one horizontal scan period of the display panel, and selects an identical wordline at least L times (L is an integer larger than one) in one vertical scan period of the display panel; and wherein the first to Nth divided data line drivers are disposed along a first direction in which the bitlines extend.

A fourth aspect of the invention relates to an electronic instrument, comprising:

the above integrated circuit device; and a display panel.

DETAILED DESCRIPTION OF THE EMBODIMENT

Figure 1A:
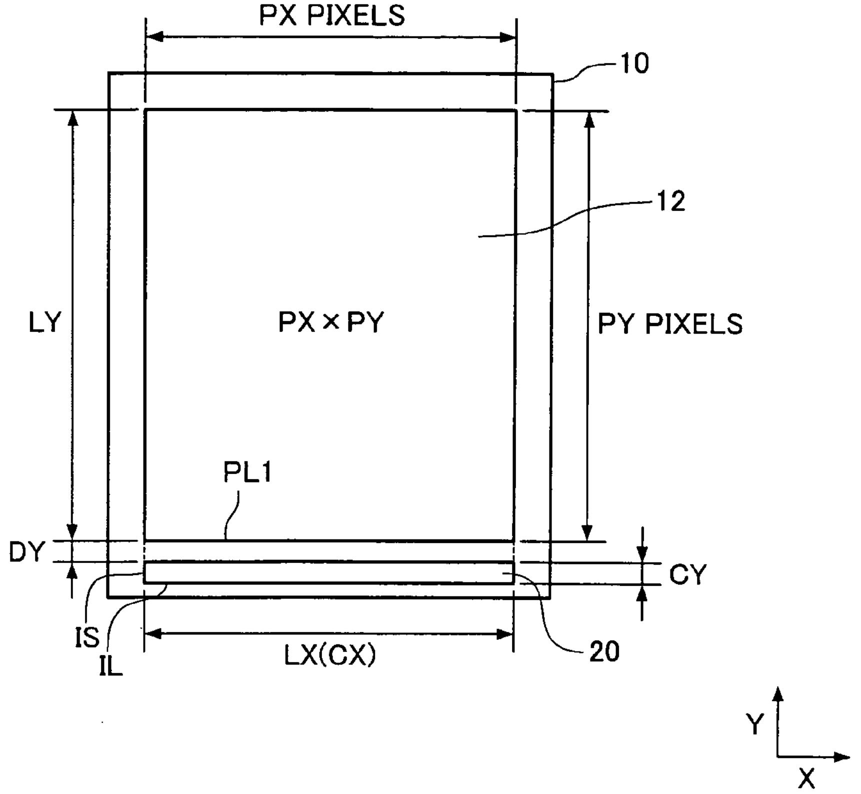
FIGS. 1A and 1B are diagrams showing an integrated circuit device according to one embodiment of the invention.

The invention may provide an integrated circuit device which allows a flexible circuit arrangement to enable an efficient layout, and an electronic instrument including the same.

An embodiment of the invention provides an integrated circuit device, comprising:

a RAM block including a plurality of wordlines, a plurality of bitlines, a plurality of memory cells, and a wordline control circuit; and a data line driver block which drives a plurality of data line groups of a display panel based on data supplied from the RAM block, wherein the data line driver block includes first to Nth (N is an integer larger than one) divided data line driver blocks, each of the first to Nth divided data line driver blocks driving a different data line group of the data line groups, wherein the wordline control circuit drives an identical wordline N times from among the wordlines in one horizontal scan period of the display panel, and wherein the first to Nth divided data line drivers are disposed along a first direction in which the bitlines extend.

According to the embodiment, since the data line driver block includes the divided data line drivers disposed along the first direction, the data line driver block can be efficiently arranged. As the resolution of the display panel is increased, the number of data lines is increased. In the embodiment, since the data line driver block can be configured by the divided data line drivers, the data line driver block can be efficiently arranged in the integrated circuit device even when driving a high-resolution display panel. Therefore, the chip area of the integrated circuit device can be reduced. Specifically, cost can be reduced. Moreover, since the width of the data line driver block can be adjusted to coincide with the width of the RAM block in the direction in which the wordlines extend, the data line driver block and the RAM block can be efficiently arranged in the integrated circuit device, whereby cost can be reduced.

With this embodiment, first to Nth latch signals may be supplied to the first to Nth divided data line drivers, respectively, and the first to Nth divided data line drivers may latch data supplied from the RAM block based on the first to Nth latch signals.

According to the embodiment, since the first to Nth divided data line drivers can latch data supplied from the RAM block based on the first to Nth latch signals, the data from the RAM block can be latched by the corresponding divided data line driver. This enables the data line driver block to drive the data line groups based on the data supplied from the RAM block.

With this embodiment, when the identical wordline is selected first time, the first latch signal may be set to active so that data supplied from the RAM block in response to the first selection is latched by the first divided data line driver, and when the identical wordline is selected Kth time ($1 \leqq K \leqq N$; K is an integer), the Kth latch signal may be set to active so that data supplied from the RAM block in response to the Kth selection is latched by the Kth divided data line driver.

This enables the data supplied from the RAM block upon Kth selection to be latched by the Kth divided data line driver corresponding to Nth wordline selection.

With this embodiment, the RAM block may include a sense amplifier circuit which outputs M-bit data (M is an integer larger than one) upon one wordline selection, at least M×N memory cells may be arranged in the RAM block along a second direction in which the wordlines extend, and (M×N)-bit data may be supplied to the sense amplifier circuit upon one wordline selection.

This enables the number of memory cells arranged in the RAM block along the direction in which the wordlines extend to be set at "M×N", whereby the memory cells can be efficiently arranged in the direction in which the wordlines extend corresponding to the size of the circuit of the RAM block such as the sense amplifier circuit. Moreover, since the number of memory cells arranged in the RAM block along the direction in which the bitlines extend can be reduced, the width of the RAM block in the direction in which the bitlines extend can be reduced.

With this embodiment, the sense amplifier circuit may detect and output M-bit data of the (M×N)-bit data based on a sense amplifier select signal.

This enables M-bit data of the (M×N)-bit data to be supplied to the data line driver block.

With this embodiment, the sense amplifier circuit may include a plurality of selective sense amplifiers, and each time the identical wordline is selected N times in the one horizontal scan period, each of the selective sense amplifiers may receive N-bit data from first to Nth memory cells of M×N memory cells connected with the selected wordline, and may detect and output 1-bit data from a Kth ($1 \leqq K \leqq N$; K is an integer) memory cell of the first to Nth memory cells based on the sense amplifier select signal.

This enables the RAM block to supply data to the data line driver block in M bit units corresponding to each of the N times of wordline selection.

With this embodiment, the sense amplifier select signal may be set so that the selective sense amplifier detects and outputs data received from the first memory cell when the identical wordline is selected first time, and detects and outputs data received from the Kth memory cell when the identical wordline is selected Kth time.

Therefore, since the selective sense amplifier can output data received from the Kth memory cell upon Kth wordline selection, data stored in the M×N memory cells can be output to the data line driver block by selecting the wordlines N times.

With this embodiment, each of the first to Nth divided data line driver may drive one of the data line groups based on the M-bit data supplied from the RAM block, and when a grayscale of a pixel corresponding to a data line is G bits, each of the first to Nth divided data line drivers may drive M/G data lines.

This enables the data line driver block to drive the N×M/G data lines.

With this embodiment, each of the first to Nth divided data line drivers may drive one of the data line groups based on the M-bit data supplied from the RAM block, and when a grayscale of a pixel corresponding to a data line is G bits, each of the first to Nth divided data line drivers may include M/G data line driver cells, and each of the M/G data line driver cells may drive one of the data lines.

This enables each data line driver cell to receive G-bit data, whereby the data line can be driven based on the grayscale G bits.

With this embodiment, the value "M/G" may be a multiple of three when the display panel performs a color display, the M/G data line driver cells may include M/3G R data line driver cells, M/3G G data line driver cells and M/3G B data line driver cells, each of M/3G R data line driver cells driving a data line corresponding to an R pixel, each of M/3G G data line driver cells driving a data line corresponding to a G pixel, and each of M/3G B data line driver cells driving a data line corresponding to a B pixel, and the M/G data line driver cells may be arranged so that the R data line driver cells, the G data line driver cells, and the B data line driver cells are alternately disposed.

This enables the data line driver cells to be disposed along the second direction, whereby the data line driver block can be efficiently arranged even if the divided data line drivers are disposed along the first direction.

With this embodiment, the value "N" may be a multiple of three when the display panel performs a color display, the M/G data line driver cells in a first group when dividing the first to Nth divided data line drivers into three groups may include M/G R data line driver cells, each of which drives a data line corresponding to an R pixel, the M/G data line driver cells in a second group may include M/G G data line driver cells, each of which drives a data line corresponding to a G pixel, wherein the M/G data line driver cells in a third group may include M/G B data line driver cells, each of which drives a data line corresponding to a B pixel, and wherein the M/G data line driver cells may be arranged along the second direction.

According to the embodiment, the data line driver block can sequentially latch data corresponding to the R pixel, data corresponding to the G pixel, and data corresponding to the B pixel, for example. Therefore, when the data line driver block drives the data lines immediately after latching the data, all the data lines corresponding to the R pixels are driven first, and the data lines corresponding to the G pixels and the B pixels are driven thereafter. Specifically, since consecutive data lines which are not temporarily driven do not occur even when one horizontal scan period is reduced due to an increase in resolution, whereby deterioration of the image quality can be prevented.

With this embodiment, each of the first to Nth divided data line drivers may include first to Sth (S is an integer larger than one) subdivided data line drivers into which the divided data line driver is subdivided, when a grayscale of a pixel corresponding to a data line is G bits, each of the first to Sth subdivided data line drivers may include M/(G×S) data line driver cells, each of which drives one of the data lines, and the first to Sth subdivided data line drivers may be disposed along the first direction.

This enables the divided data line drivers to be efficiently arranged, whereby the data line driver block can be efficiently arranged in the integrated circuit device.

With this embodiment, an identical latch signal of the first to Nth latch signals may be supplied to each of the first to Sth subdivided data line drivers.

This enables the subdivided data line drivers to be disposed along the first direction without complicating the control.

Another embodiment of the invention provides an integrated circuit device, comprising:

a RAM block including a plurality of wordlines, a plurality of bitlines, a plurality of memory cells, and a wordline control circuit; and a data line driver block which drives a plurality of data line groups of a display panel based on data supplied from the RAM block, wherein the data line driver block includes first to Nth (N is an integer larger than one) divided data line driver blocks, each of the first to Nth divided data line driver blocks driving a different data line group of the data line groups, wherein the wordline control circuit controls (L×J=N) times of reading of data from the RAM block in one horizontal scan period of the display panel, by selecting an identical wordline L times (L is an integer larger than one) and J wordlines (J is an integer larger than one) as the identical wordline selected L times in the one horizontal scan period, and wherein the first to Nth divided data line drivers are disposed along a first direction in which the bitlines extend.

Therefore, the number of different wordlines selected in one horizontal scan period can be set at J while selecting the wordlines L×J times in one horizontal scan period. Therefore, even if the number of times the wordline is selected in one horizontal scan period is increased, an increase of the number of wordlines in the RAM block can be reduced. Specifically, the width of the RAM block in the first direction can be reduced.

A further embodiment of the invention provides an integrated circuit device, comprising:

a RAM block including a plurality of wordlines, a plurality of bitlines, a plurality of memory cells, and a wordline control circuit; and a data line driver block which drives a plurality of data line groups of a display panel based on data supplied from the RAM block, wherein the data line driver block includes first to Nth (N is an integer larger than one) divided data line driver blocks, each of the first to Nth divided data line driver blocks driving a different data line group of the data line groups, wherein the wordline control circuit sequentially selects N (N is an integer larger than one) different wordlines in one horizontal scan period of the display panel, and selects an identical wordline at least L times (L is an integer larger than one) in one vertical scan period of the display panel; and wherein the first to Nth divided data line drivers are disposed along a first direction in which the bitlines extend.

Therefore, the identical wordline can be selected L times in one vertical scan period while selecting the wordlines N times in one horizontal scan period. Therefore, even if the number of times the wordline is selected in one horizontal scan period is increased, an increase of the number of wordlines in the RAM block can be reduced. Specifically, the width of the RAM block in the first direction can be reduced.

With this embodiment, the RAM block may include a sense amplifier circuit which outputs M-bit data (M is an integer larger than one) upon one wordline selection, at least M×L memory cells may be arranged in the RAM block along a second direction in which the wordlines extend, and (M×L)-bit data may be supplied to the sense amplifier circuit upon one wordline selection.

This enables the number of memory cells arranged in the RAM block along the direction in which the wordlines extend to be set at "M×L", whereby the memory cells can be efficiently arranged in he direction in which the wordlines extend corresponding to the size of the circuit of the RAM block such as the sense amplifier circuit. Moreover, since the number of memory cells arranged in the RAM block along the direction in which the bitlines extend can be reduced, the width of the RAM block in the direction in which the bitlines extend can be reduced.

With this embodiment, the wordlines may be formed parallel to a direction in which the data lines of the display panel extend.

In the integrated circuit device according to the embodiment, the length of the wordline can be reduced without providing a special circuit, in comparison with the case where the wordline is formed perpendicularly to the data line. In the embodiment, a host may select one of the RAM blocks and control the wordline of the selected RAM block. Since the length of the wordline to be controlled can be reduced as described above, the integrated circuit device according to the embodiment can reduce power consumption during write control from the host.

A still further embodiment of the invention provides an electronic instrument, comprising:

the above integrated circuit device; and a display panel.

With this embodiment, the integrated circuit device may be mounted on a substrate which forms the display panel.

Note that the embodiments described hereunder do not in any way limit the scope of the invention defined by the claims laid out herein. Note also that not all of the elements of these embodiments should be taken as essential requirements to the means of the present invention. In the drawings, sections indicated by the same symbols have the same meanings.

1. Display Driver

FIG. 1A shows a display panel 10 on which a display driver 20 (integrated circuit device in a broad sense) is mounted. In the embodiment, the display driver 20 or the display panel 10 on which the display driver 20 is mounted may be provided in a small electronic instrument (not shown in FIG. 1A). As examples of the small electronic instrument, a portable telephone, a PDA, a digital music player including a display panel, and the like can be given. In the display panel 10, a plurality of display pixels are formed on a glass substrate, for example. A plurality of data lines (not shown) extending in a direction Y and a plurality of scan lines (not shown) extending in a direction X are formed in the display panel 10 corresponding to the display pixels. The display pixel formed in the display panel 10 of the embodiment is a liquid crystal element. However, the display pixel is not limited to the liquid crystal element. The display pixel may be a light-emitting element such as an electroluminescence (EL) element. The display pixel may be either an active type including a transistor or the like or a passive type which does not include a transistor or the like. When the active type display pixel is applied to a display region 12, the liquid crystal pixel may include an amorphous TFT or a low-temperature polysilicon TFT.

The display panel 10 includes the display region 12 having PX pixels in the direction X and PY pixels in the direction Y, for example. When the display panel 10 supports a QVGA display, PX is 240 and PY is 320 so that the display region 12 is displayed in 240×320 pixels. The number of pixels PX of the display panel 10 in the direction X coincides with the number of data lines in the case of a black and white display. In the case of a color display, one pixel is formed by three subpixels including an R subpixel (R pixel in a broad sense), a G subpixel (G pixel in a broad sense), and a B subpixel (B pixel, in a broad sense). Therefore, the number of data lines is "3×PX" in the case of a color display. Accordingly, the "number of pixels corresponding to the data lines" means the "number of subpixels in the direction X" in the case of a color display. The number of bits of each subpixel is determined corresponding to the grayscale. When the grayscale values of three subpixels are respectively G, the grayscale value of one pixel is 3G bits. When the subpixel represents 64 grayscales (six bits), the amount of data for one pixel is 6×3=18 bits.

The relationship between the number of pixels PX and the number of pixels PY may be PX>PY, PX<PY, or PX=PY.

The display driver 20 has a length CX in the direction X and a length CY in the direction Y. A long side IL of the display driver 20 having the length CX is parallel to a side PL1 of the display region 12 on the side of the display driver 20. Specifically, the display driver 20 is mounted on the display panel 10 so that the long side IL is parallel to the side PL1 of the display region 12.

Figure 1B:
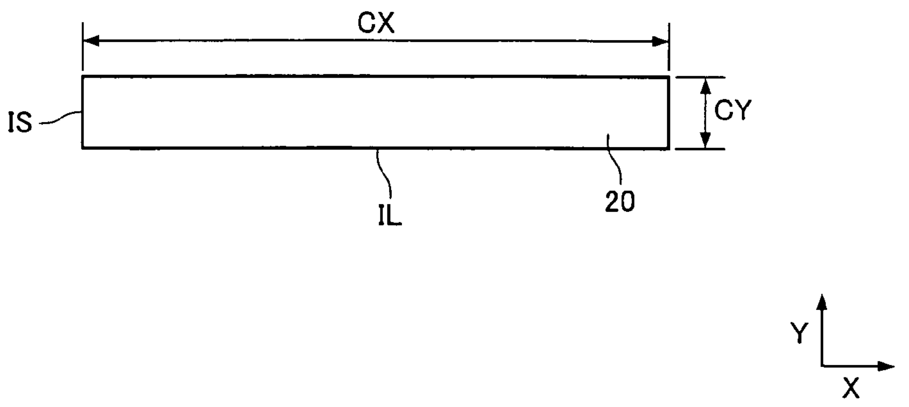

FIG. 1B is a diagram showing the size of the display driver 20. The ratio of a short side IS of the display driver 20 having the length CY to the long side IL of the display driver 20 is set at 1:10, for example. Specifically, the short side IS of the display driver 20 is set to be much shorter than the long side IL. The chip size of the display driver 20 in the direction Y can be minimized by forming such a narrow display driver 20.

The above-mentioned ratio "1:10" is merely an example. The ratio is not limited thereto. For example, the ratio may be 1:11 or 1:9.

FIG. 1A shows the case where the display region 12 has the length LX in the direction X and the length LY in the direction Y. The aspect (height/width) ratio of the display region 12 is not limited to that shown in FIG. 1A. The length LY of the display region 12 may be shorter than the length LX, for example.

In FIG. 1A, the length LX of the display region 12 in the direction X is equal to the length CX of the display driver 20 in the direction X. It is preferable that the length LX and the length CX be equal as shown in FIG. 1A, although the configuration is not limited to that shown in FIG. 1A. The reason is described below with reference to FIG. 2A.

Figure 2A:
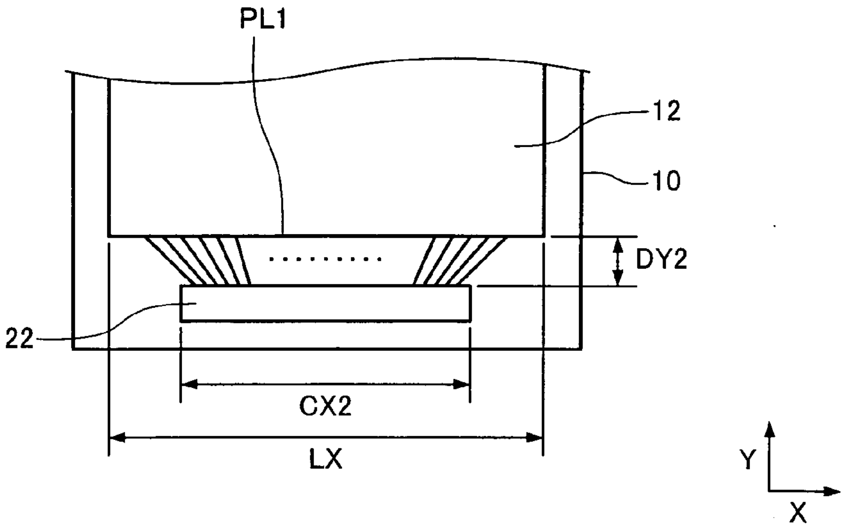
FIG. 2A is a diagram showing a part of a comparative example according to the embodiment.

In a display driver 22 shown in FIG. 2A, the length in the direction X is set at CX2. Since the length CX2 is shorter than the length LX of the side PL1 of the display region 12, a plurality of interconnects which connect the display driver 22 with the display region 12 cannot be provided parallel to the direction Y, as shown in FIG. 2A. Therefore, it is necessary to increase a distance DY2 between the display region 12 and the display driver 22. As a result, since the size of the glass substrate of the display panel 10 must be increased, a reduction in cost is hindered. Moreover, when providing the display panel 10 in a smaller electronic instrument, the area other than the display region 12 is increased, whereby a reduction in size of the electronic instrument is hindered.

Figure 2B:
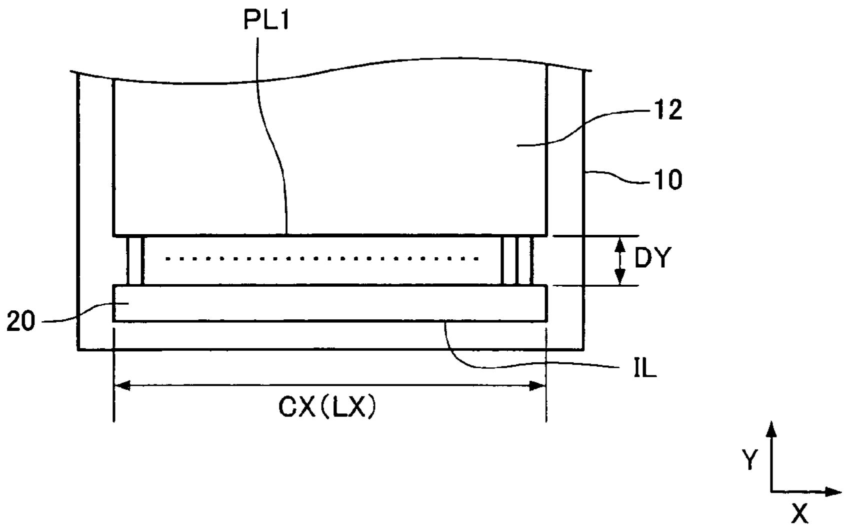
FIG. 2B is a diagram showing a part of the integrated circuit device according to the embodiment.

On the other hand, since the display driver 20 of the embodiment is formed so that the length CX of the long side IL is equal to the length LX of the side PL1 of the display region 12 as shown in FIG. 2B, the interconnects between the display driver 20 and the display region 12 can be provided parallel to the direction Y. This enables a distance DY between the display driver 20 and the display region 12 to be reduced in comparison with FIG. 2A. Moreover, since the length IS of the display driver 20 in the direction Y is small, the size of the glass substrate of the display panel 10 in the direction Y is reduced, whereby the size of an electronic instrument can be reduced.

In the embodiment, the display driver 20 is formed so that the length CX of the long side IL is equal to the length LX of the side PL1 of the display region 12. However, the invention is not limited thereto.

The distance DY can be reduced while achieving a reduction in the chip size by setting the length of the long side IL of the display driver 20 to be equal to the length LX of the side PL1 of the display region 12 and reducing the length of the short side IS. Therefore, manufacturing cost of the display driver 20 and manufacturing cost of the display panel 10 can be reduced.

Figure 3A:
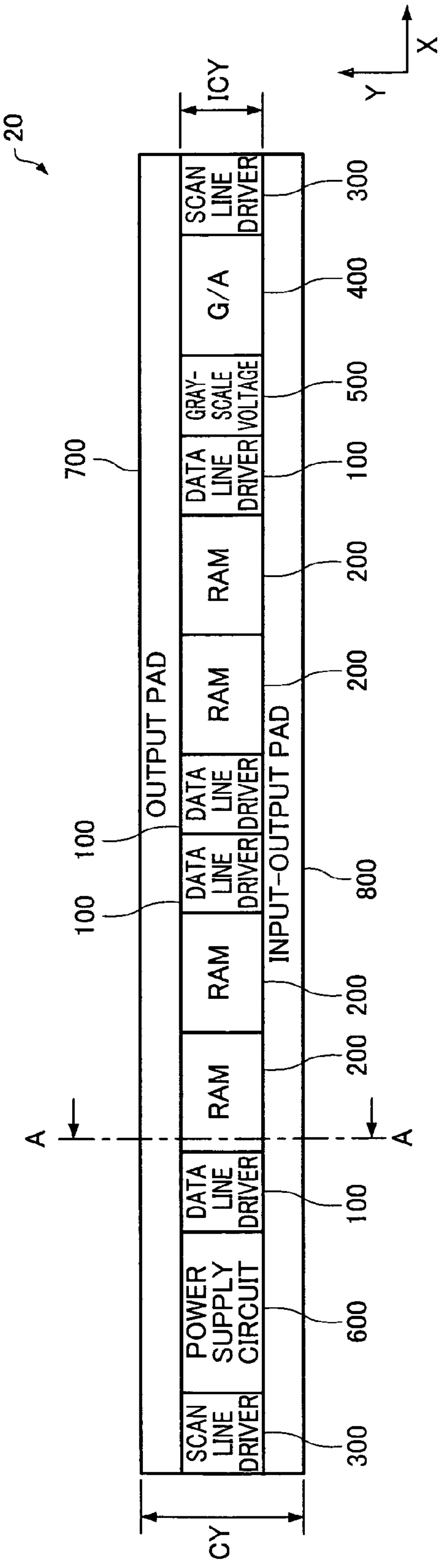
FIGS. 3A and 3B are diagrams showing a configuration example of the integrated circuit device according to the embodiment.
Figure 3B:
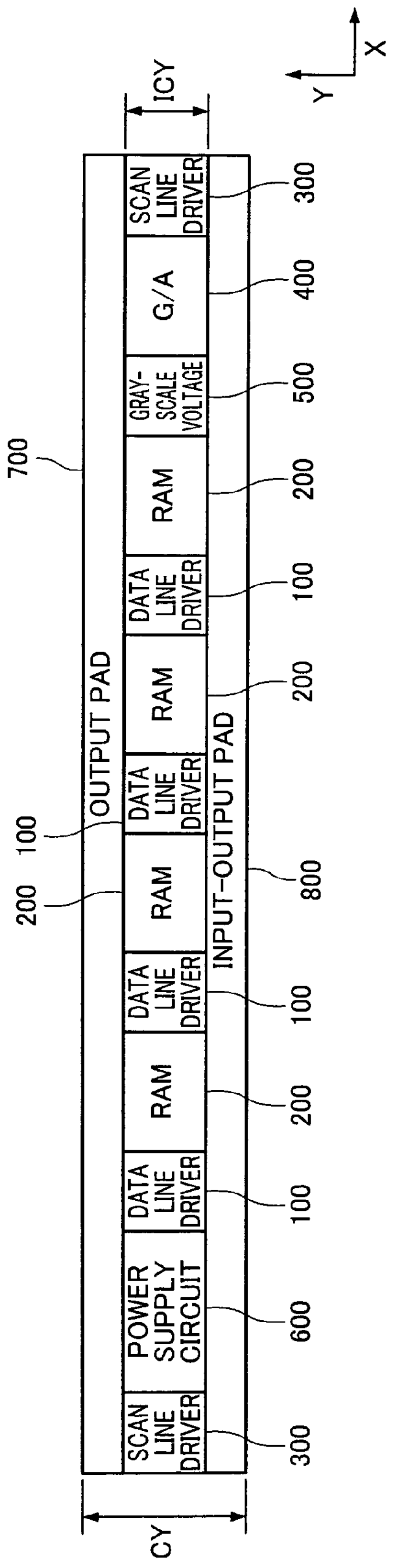

FIGS. 3A and 3B are diagrams showing a layout configuration example of the display driver 20 of the embodiment. As shown in FIG. 3A, the display driver 20 includes a data line driver 100 (data line driver block in a broad sense), a RAM 200 (RAM block in a broad sense), a scan line driver 300, a G/A circuit 400 (gate array circuit; automatic routing circuit in a broad sense), a grayscale voltage generation circuit 500, and a power supply circuit 600, disposed along the direction X. These circuits are disposed within a block width ICY of the display driver 20. An output PAD 700 and an input-output PAD 800 are provided in the display driver 20 with these circuits interposed therebetween. The output PAD 700 and the input-output PAD 800 are formed along the direction X. The output PAD 700 is provided on the side of the display region 12. A signal line for supplying control information from a host (e.g. MPU, baseband engine (BBE), MGE, or CPU), a power supply line, and the like are connected with the input-output PAD 800, for example.

The data lines of the display panel 10 are divided into a plurality of (e.g. four) blocks, and one data line driver 100 drives the data lines for one block.

It is possible to flexibly meet the user's needs by providing the block width ICY and disposing each circuit within the block width ICY. In more detail, since the number of data lines which drive the pixels is changed when the number of pixels PX of the drive target display panel 10 in the direction X is changed, it is necessary to design the data line driver 100 and the RAM 200 corresponding to such a change in the number of data lines. In a display driver for a low-temperature polysilicon (LTPS) TFT panel, since the scan driver 300 can be formed on the glass substrate, the scan line driver 300 may not be provided in the display driver 20.

In the embodiment, the display driver 20 can be designed merely by changing the data line driver 100 and the RAM 200 or removing the scan line driver 300. Therefore, since it is unnecessary to newly design the display driver 20 by utilizing the original layout, design cost can be reduced.

In FIG. 3A, two RAMs 200 are disposed adjacent to each other. This enables a part of the circuits used for the RAM 200 to be used in common, whereby the area of the RAM 200 can be reduced. The detailed effects are described later. In the embodiment, the display driver is not limited to the display driver 20 shown in FIG. 3A. For example, the data line driver 100 and the RAM 200 may be adjacent to each other and two RAMs 200 may not be disposed adjacent to each other, as in a display driver 24 shown in FIG. 3B.

In FIGS. 3A and 3B, four data line drivers 100 and four RAMs 200 are provided as an example. The data lines driven in one horizontal scan period (also called "1H period") can be divided into four groups by providing four data line drivers 100 and four RAMs 200 (4BANK) in the display driver 20. When the number of pixels PX is 240, it is necessary to drive 720 data lines in the 1H period taking the R subpixel, G subpixel, and B subpixel into consideration, for example. In the embodiment, it suffices that each data line driver 100 drive 180 data lines (¼ of the 720 data lines). The number of data lines driven by each data line driver 100 can be reduced by increasing the number of BANKs. The number of BANKs is defined as the number of RAMs 200 provided in the display driver 20. The total storage area of the RAMs 200 is defined as the storage area of a display memory. The display memory may store at least data for displaying an image for one frame in the display panel 10.

Figure 4:
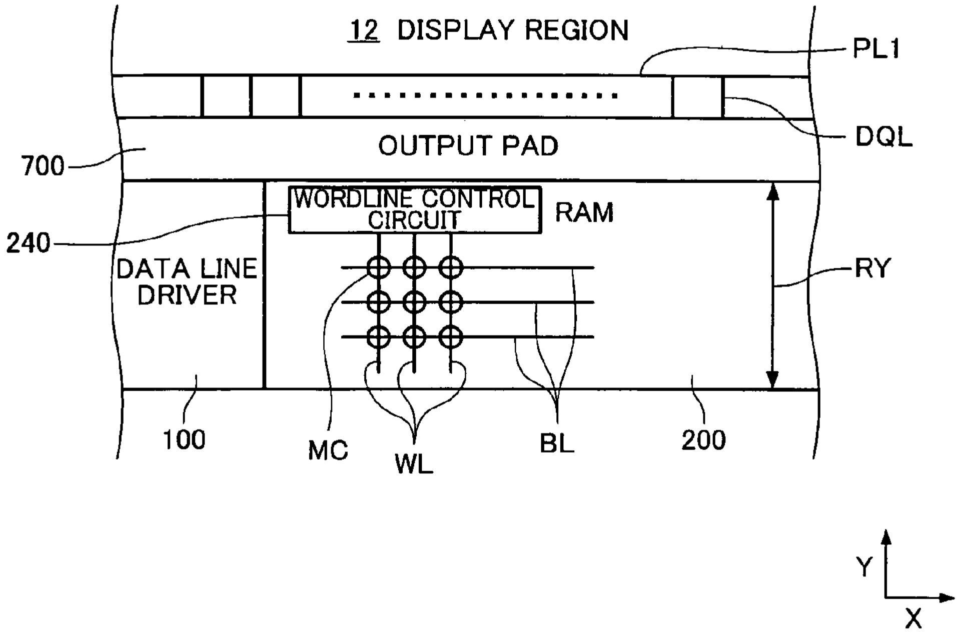
FIG. 4 is a configuration example of a display memory according to the embodiment.

FIG. 4 is an enlarged diagram of a part of the display panel 10 on which the display driver 20 is mounted. The display region 12 is connected with the output PAD 700 of the display driver 20 through interconnects DQL. The interconnect may be an interconnect provided on the glass substrate, or may be an interconnect formed on a flexible substrate or the like and connects the output PAD 700 with the display region 12.

The length of the RAM 200 in the direction Y is set at RY. In the embodiment, the length RY is set to be equal to the block width ICY shown in FIG. 3A. However, the invention is not limited thereto. For example, the length RY may be set to be equal to or less than the block width ICY.

The RAM 200 having the length RY includes a plurality of wordlines WL and a wordline control circuit 240 which controls the wordlines WL. The RAM 200 includes a plurality of bitlines BL, a plurality of memory cells MC, and a control circuit (not shown in FIG. 4) which controls the bitlines BL and the memory cells MC. The bitlines BL of the RAM 200 are provided parallel to the direction X (a first direction in a broad sense). Specifically, the bitlines BL are provided parallel to the side PL1 of the display region 12. The wordlines WL of the RAM 200 are provided parallel to the direction Y (a second direction in a broad sense). Specifically, the wordlines WL are provided parallel to the interconnects DQL.

Data is read from the memory cell MC of the RAM 200 by controlling the wordline WL, and the data read from the memory cell MC is supplied to the data line driver 100. Specifically, when the wordline WL is selected, data stored in the memory cells MC arranged along the direction Y is supplied to the data line driver 100.

Figure 5:
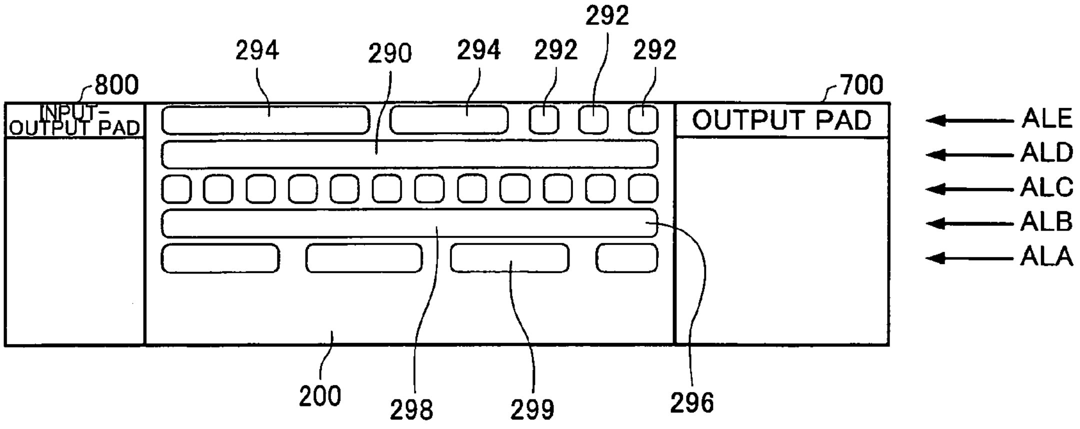
FIG. 5 is a cross-sectional diagram of the integrated circuit device according to the embodiment.

FIG. 5 is a cross-sectional diagram showing the cross section A-A shown in FIG. 3A. The cross section A-A is the cross section in the region in which the memory cells MC of the RAM 200 are arranged. For example, five metal interconnect layers are provided in the region in which the RAM 200 is formed. A first metal interconnect layer ALA, a second metal interconnect layer ALB, a third metal interconnect layer ALC, a fourth metal interconnect layer ALD, and a fifth metal interconnect layer ALE are illustrated in FIG. 5. A grayscale voltage interconnect 292 to which a grayscale voltage is supplied from the grayscale voltage generation circuit 500 is formed in the fifth metal interconnect layer ALE, for example. A power supply interconnect 294 for supplying a voltage supplied from the power supply circuit 600, a voltage supplied from the outside through the input-output PAD 800, or the like is also formed in the fifth metal interconnect layer ALE. The RAM 200 of the embodiment may be formed without using the fifth metal interconnect layer ALE, for example. Therefore, various interconnects can be formed in the fifth metal interconnect layer ALE as described above.

A shield layer 290 is formed in the fourth metal interconnect layer ALD. This enables effects exerted on the memory cells MC of the RAM 200 to be reduced even if various interconnects are formed in the fifth metal interconnect layer ALE in the upper layer of the memory cells MC of the RAM 200. A signal interconnect for controlling the control circuit for the RAM 200, such as the wordline control circuit 240, may be formed in the fourth metal interconnect layer ALD in the region in which the control circuit is formed.

An interconnect 296 formed in the third metal interconnect layer ALC may be used as the bitline BL or a voltage VSS interconnect, for example. An interconnect 298 formed in the second metal interconnect layer ALB may be used as the wordline WL or a voltage VDD interconnect, for example. An interconnect 299 formed in the first metal interconnect layer ALA may be used to connect with each node formed in a semiconductor layer of the RAM 200.

The wordline interconnect may be formed in the third metal interconnect layer ALC, and the bitline interconnect may be formed in the second metal interconnect layer ALB, differing from the above-described configuration.

As described above, since various interconnects can be formed in the fifth metal interconnect layer ALE of the RAM 200, various types of circuit blocks can be arranged along the direction X as shown in FIGS. 3A and 3B.

2. Data Line Driver

2.1 Configuration of Data Line Driver

Figure 6A:
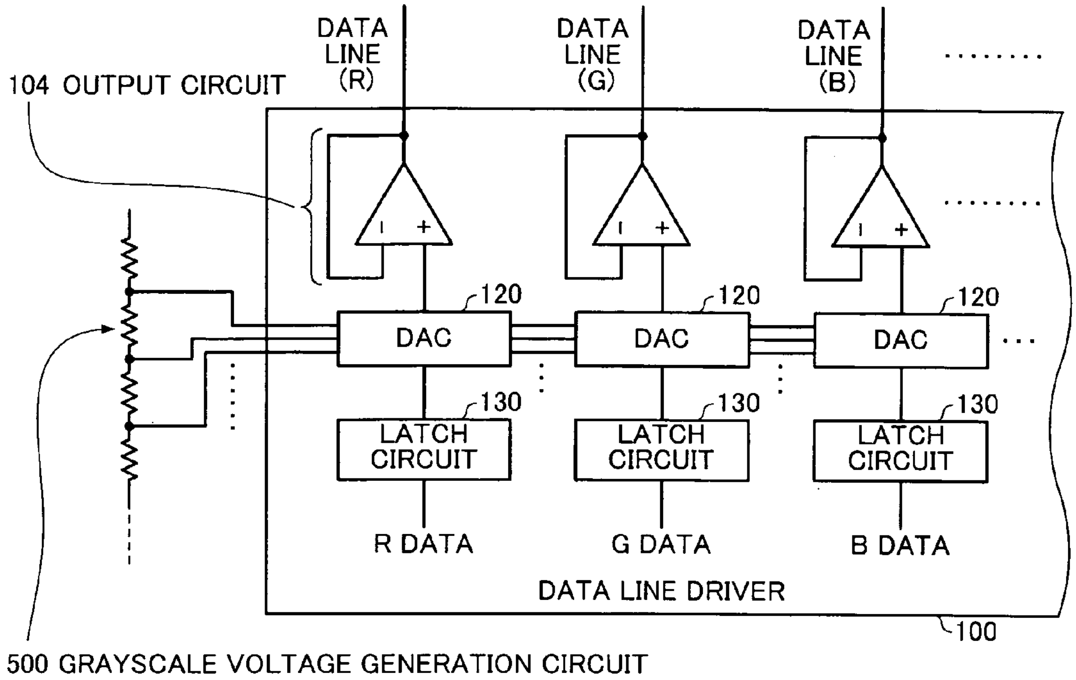
FIGS. 6A and 6B are diagrams showing configuration examples of a data line driver.

FIG. 6A is a diagram showing the data line driver 100. The data line driver 100 includes an output circuit 104, a DAC 120, and a latch circuit 130. The DAC 120 supplies the grayscale voltage to the output circuit 104 based on data latched by the latch circuit 130. The data supplied from the RAM 200 is stored in the latch circuit 130, for example. When the grayscale is set at G bits, G-bit data is stored in each latch circuit 130, for example. A plurality of grayscale voltages are generated according to the grayscale, and supplied to the data line driver 100 from the grayscale voltage generation circuit 500. For example, the grayscale voltages supplied to the data line driver 100 are supplied to the DAC 120. The DAC 120 selects the corresponding grayscale voltage from the grayscale voltages supplied from the grayscale voltage generation circuit 500 based on the G-bit data latched by the latch circuit 130, and outputs the selected grayscale voltage to the output circuit 104.

Figure 6B:
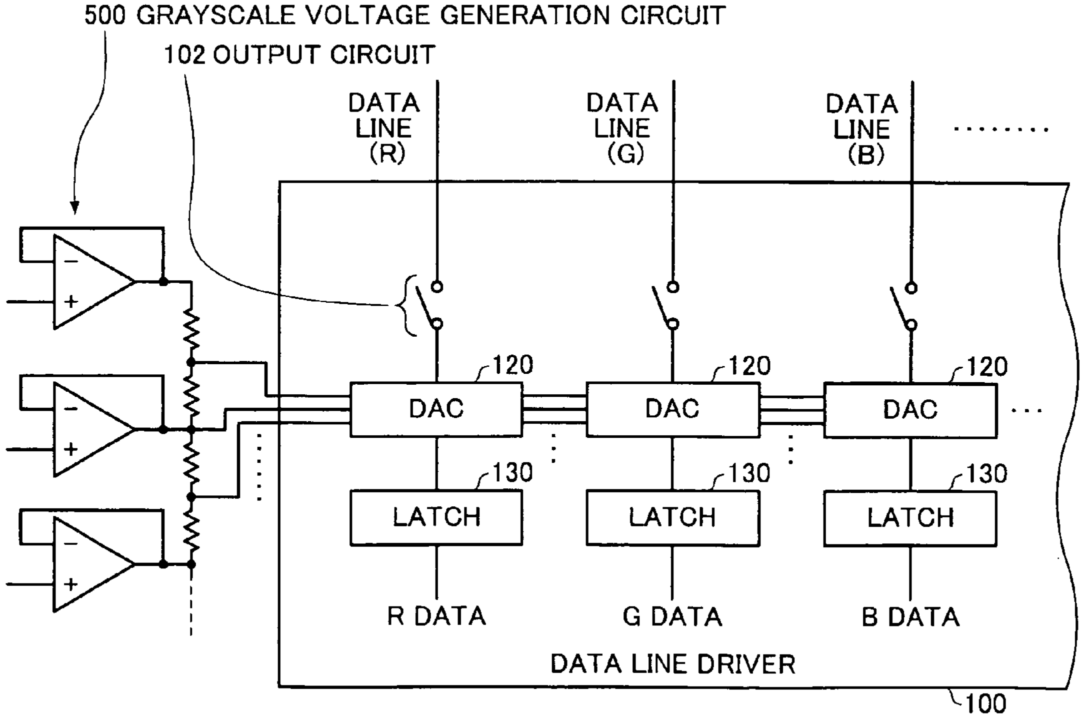

The output circuit 104 is formed by an operational amplifier, for example. However, the invention is not limited thereto. As shown in FIG. 6B, an output circuit 102 may be provided in the data line driver 100 instead of the output circuit 104. In this case, a plurality of operational amplifiers are provided in the grayscale voltage generation circuit 500.

Figure 7:
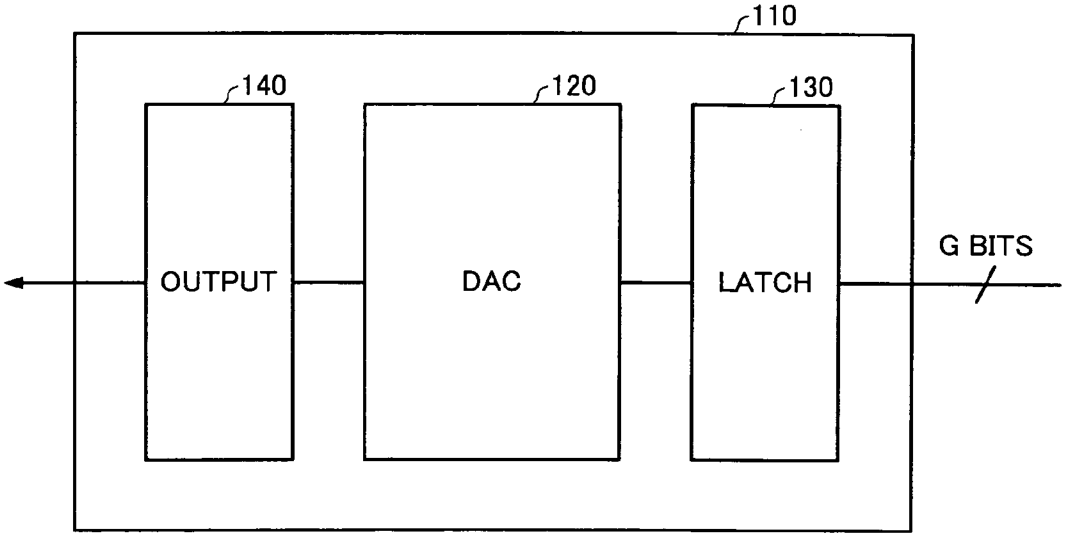
FIG. 7 is a configuration example of a data line driver cell according to the embodiment.

FIG. 7 is a diagram showing a plurality of data line driver cells 110 provided in the data line driver 100. The data line driver 100 drives the data lines, and the data line driver cell 110 drives one of the data lines. For example, the data line driver cell 110 drives one of the R subpixel, the G subpixel, and the B subpixel which make up one pixel. Specifically, when the number of pixels PX in the direction X is 240, 720 (=240×3) data line driver cells 110 in total are provided in the display driver 20. In the 4BANK configuration, 180 data line driver cells 110 are provided in each data line driver 100.

The data line driver cell 110 includes an output circuit 140, the DAC 120, and the latch circuit 130, for example. However, the invention is not limited thereto. For example, the output circuit 140 may be provided outside the data line driver cell 110. The output circuit 140 may be either the output circuit 104 shown in FIG. 6A or the output circuit 102 shown in FIG. 6B.

When the grayscale data indicating the grayscales of the R subpixel, the G subpixel, and the B subpixel is set at G bits, G-bit data is supplied to the data line driver cell 110 from the RAM 200. The latch circuit 130 latches the G-bit data. The DAC 120 outputs the grayscale voltage through the output circuit 140 based on the output from the latch circuit 130. This enables the data line provided in the display panel 10 to be driven.

2.2 A Plurality of Readings in One Horizontal Scan Period

Figure 8:
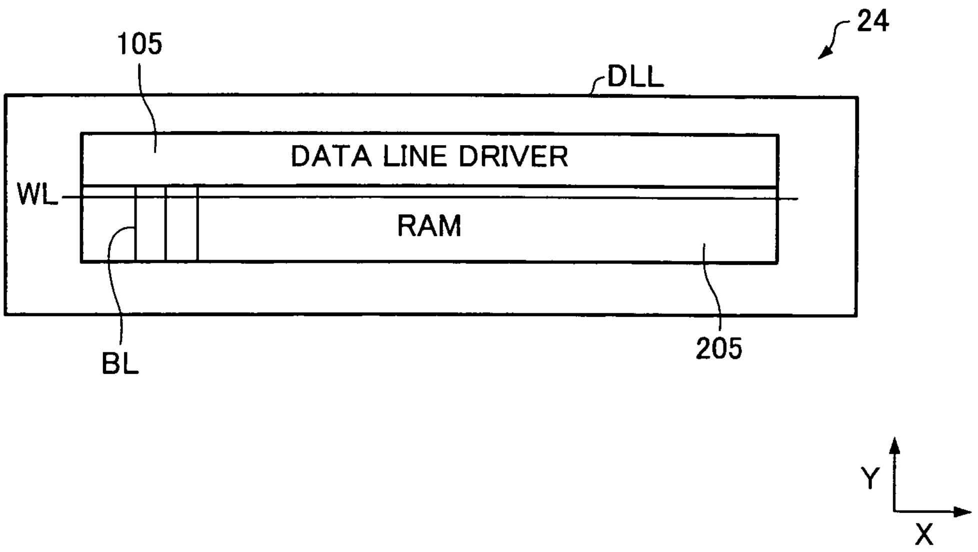
FIG. 8 is a diagram showing a comparative example according to the embodiment.

FIG. 8 shows a display driver 24 of a comparative example according to the embodiment. The display driver 24 is mounted so that a side DLL of the display driver 24 faces the side PL1 of the display panel 10 on the side of the display region 12. The display driver 24 includes a RAM 205 and a data line driver 105 of which the length in the direction X is greater than the length in the direction Y. The lengths of the RAM 205 and the data line driver 105 in the direction X are increased as the number of pixels PX of the display panels 10 is increased. The RAM 205 includes a plurality of wordlines WL and a plurality of bitlines BL. The wordline WL of the RAM 205 is formed to extend along the direction X, and the bitline BL is formed to extend along the direction Y Specifically, the wordline WL is formed to be significantly longer than the bitline BL. Since the bitline BL is formed to extend along the direction Y, the bitline BL is parallel to the data line of the display panel 10 and intersects the side PL1 of the display panel 10 at right angles.

The display driver 24 selects the wordline WL once in the 1H period. The data line driver 105 latches data output from the RAM 205 upon selection of the wordline WL, and drives the data lines. In the display driver 24, since the wordline WL is significantly longer than the bitline BL as shown in FIG. 8, the data line driver 100 and the RAM 205 are longer in the direction X, so that it is difficult to secure space for disposing other circuits in the display driver 24. This hinders a reduction in the chip area of the display driver 24. Moreover, since the design time for securing the space and the like is necessary, a reduction in design cost is made difficult.

Figure 9A:
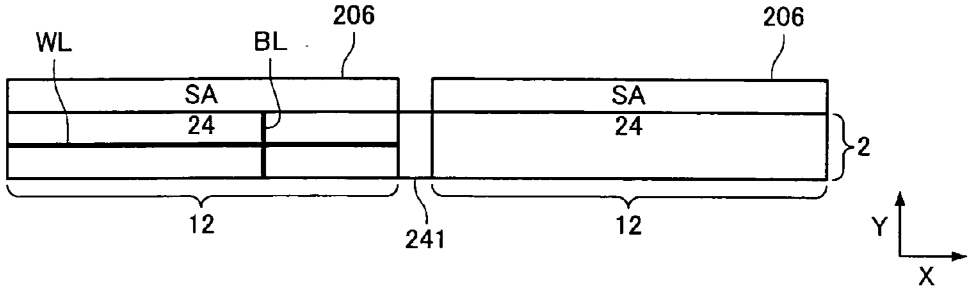
FIGS. 9A to 9D are diagrams illustrative of the effect of a RAM block according to the embodiment.

The RAM 205 shown in FIG. 8 is disposed as shown in FIG. 9A, for example. In FIG. 9A, the RAM 205 is divided into two blocks. The length of one of the divided blocks in the direction X is "12", and the length in the direction Y is "2", for example. Therefore, the area of the RAM 205 may be indicated by "48". These length values indicate an example of the ratio which indicates the size of the RAM 205. The actual size is not limited to these length values. In FIGS. 9A to 9D, reference numerals 241 to 244 indicate wordline control circuits, and reference numerals 206 to 209 indicate sense amplifiers.

Figure 9B:
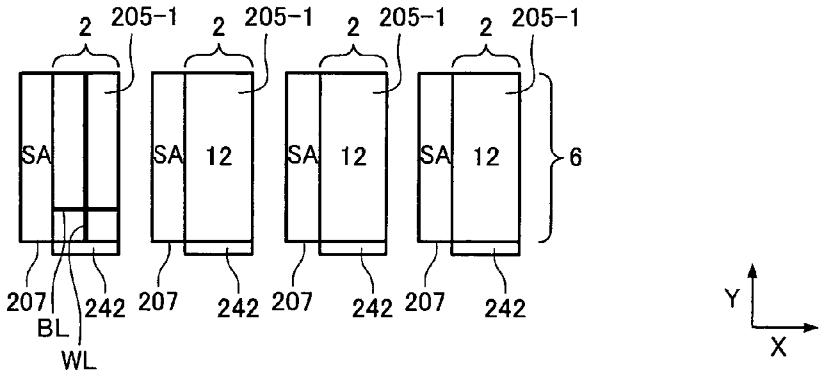

In the embodiment, the RAM 205 may be divided into a plurality of blocks and disposed in a state in which the divided blocks are rotated at 90 degrees. For example, the RAM 205 may be divided into four blocks and disposed in a state in which the divided blocks are rotated at 90 degrees, as shown in FIG. 9B. A RAM 205-1, which is one of the four divided blocks, includes a sense amplifier 207 and the wordline control circuit 242. The length of the RAM 205-1 in the direction Y is "6", and the length in the direction X is "2". Therefore, the area of the RAM 205-1 is "12" so that the total area of the four blocks is "48". However, since it is desired to reduce the length CY of the display driver 20 in the direction Y, the state shown in FIG. 9B is inconvenient.

Figure 9C:
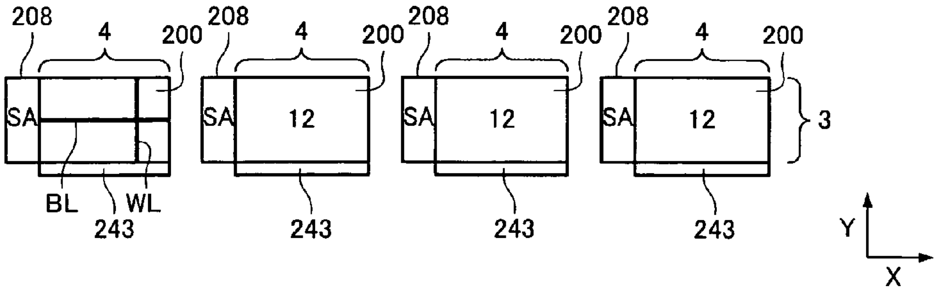

In the embodiment, the length RY of the RAM 200 in the direction Y can be reduced by reading data a plurality of times in the 1H period, as shown in FIG. 9C. FIG. 9C shows an example of reading data twice in the 1H period. In this case, since the wordline WL is selected twice in the 1H period, the number of memory cells MC arranged in the direction Y can be halved, for example. This enables the length of the RAM 200 in the direction Y to be reduced to "3", as shown in FIG. 9C. The length of the RAM 200 in the direction X is increased to "4". Specifically, the total area of the RAM 200 becomes "48", so that the RAM 200 becomes equal to the RAM 205 shown in FIG. 9A as to the area of the region in which the memory cells MC are arranged. Since the RAM 200 can be freely disposed as shown in FIGS. 3A and 3B, a very flexible layout becomes possible, whereby an efficient layout can be achieved.

Figure 9D:
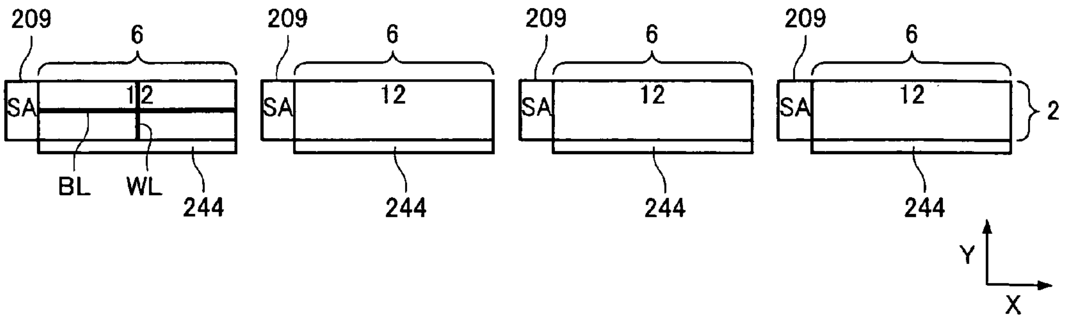

FIG. 9D shows an example of reading data three times. In this case, the length "6" of the RAM 205-1 shown in FIG. 9B in the direction Y can be reduced by ⅓. Specifically, the length CY of the display driver 20 in the direction Y can be reduced by adjusting the number of readings in the 1H period.

Figure 10:
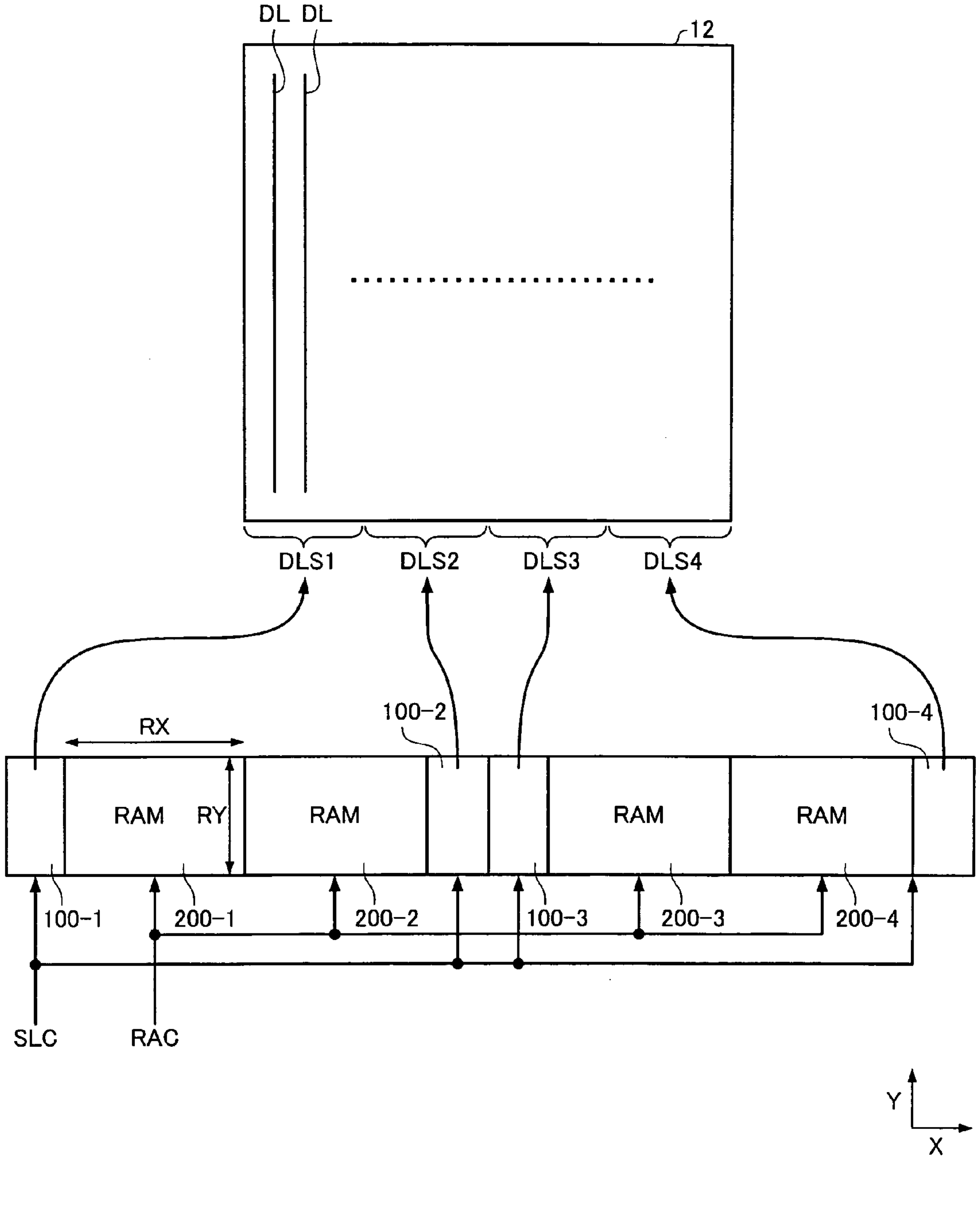
FIG. 10 is a diagram showing the relationship of the RAM blocks according to the embodiment.

In the embodiment, the RAM 200 divided into blocks can be provided in the display driver 20 as described above. In the embodiment, the 4BANK RAMs 200 can be provided in the display driver 20, for example. In this case, data line drivers 100-1 to 100-4 corresponding to each RAM 200 drive the corresponding data lines DL as shown in FIG. 10.

In more detail, the data line driver 100-1 drives a data line group DLS1, the data line driver 100-2 drives a data line group DLS2, the data line driver 100-3 drives a data line group DLS3, and the data line driver 100-4 drives a data line group DLS4. Each of the data line groups DLS1 to DLS4 is one of four blocks into which the data lines DL provided in the display region 12 of the display panel 10 are divided, for example. The data lines of the display panel 10 can be driven by providing four data line drivers 100-1 to 100-4 corresponding to the 4BANK RAM 200 and causing the data line drivers 100-1 to 100-4 to drive the corresponding data lines.

2.3 Divided Structure of Data Line Driver

Figure 11A:
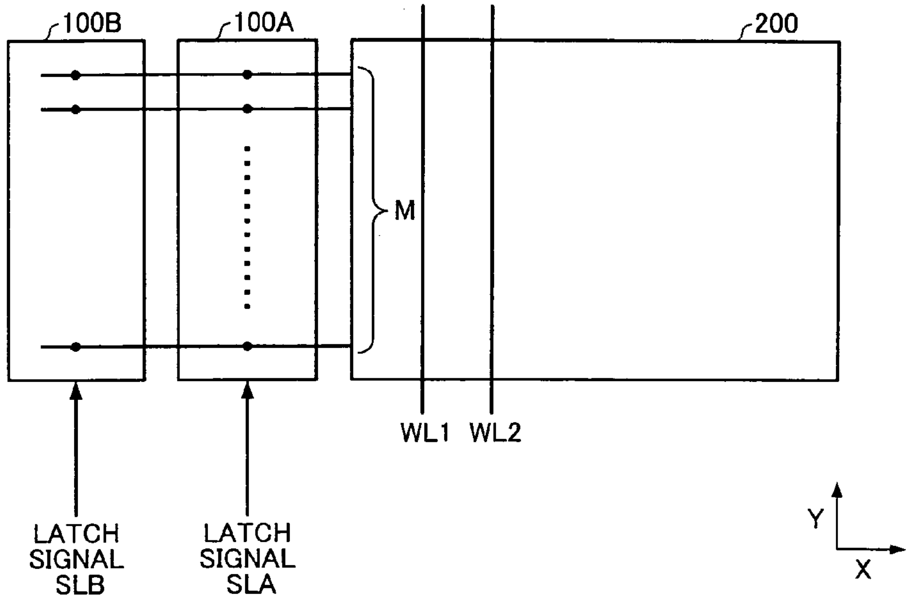
FIGS. 11A and 11B are diagrams illustrative of reading of data from the RAM block.

In the embodiment, on the premise that data is read N times (e.g. twice) in one horizontal scan period in order to reduce the length RY of the RAM 200 shown in FIG. 4, the data line driver 100 is divided into N (two) blocks including a first data line driver 100A (first divided data line driver in a broad sense) and a second data line driver 100B (second divided data line driver in a broad sense), as shown in FIG. 11A. A reference character "M" shown in FIG. 11A indicates the number of bits of data read from the RAM 200 by one wordline selection.

A plurality of data line driver cells 110 are provided in each of the data line drivers 100A and 100B. In more detail, M/G data line driver cells 110 are provided in the data line drivers 100A and 100B. When performing a color display, M/3G R data line driver cells 110, M/3G R data line driver cells 110, and M/3G R data line driver cells 110 are provided in each of the data line drivers 100A and 100B.

For example, when the number of pixels PX is 240, the grayscale of the pixel is 18 bits, and the number of BANKs of the RAM 200 is four (4BANK), 1080 (=240×18÷4) bits of data must be output from each RAM 200 in the 1H period.

However, it is desired to reduce the length RY of the RAM 200 in order to reduce the chip area of the display driver 100. Therefore, the data line driver 100 is divided into the data line drivers 100A and 100B in the direction X, as shown in FIG. 11A. This enables M to be set at 540 (=1080÷2) so that the length RY of the RAM 200 can be approximately halved.

The data line driver 100A drives a part of the data lines of the display panel 10. The data line driver 100B drives a part of the data lines of the display panel 10 other than the data lines driven by the data line driver 100A. As described above, the data line drivers 100A and 100B cooperate to drive the data lines of the display panel 10.

Figure 11B:
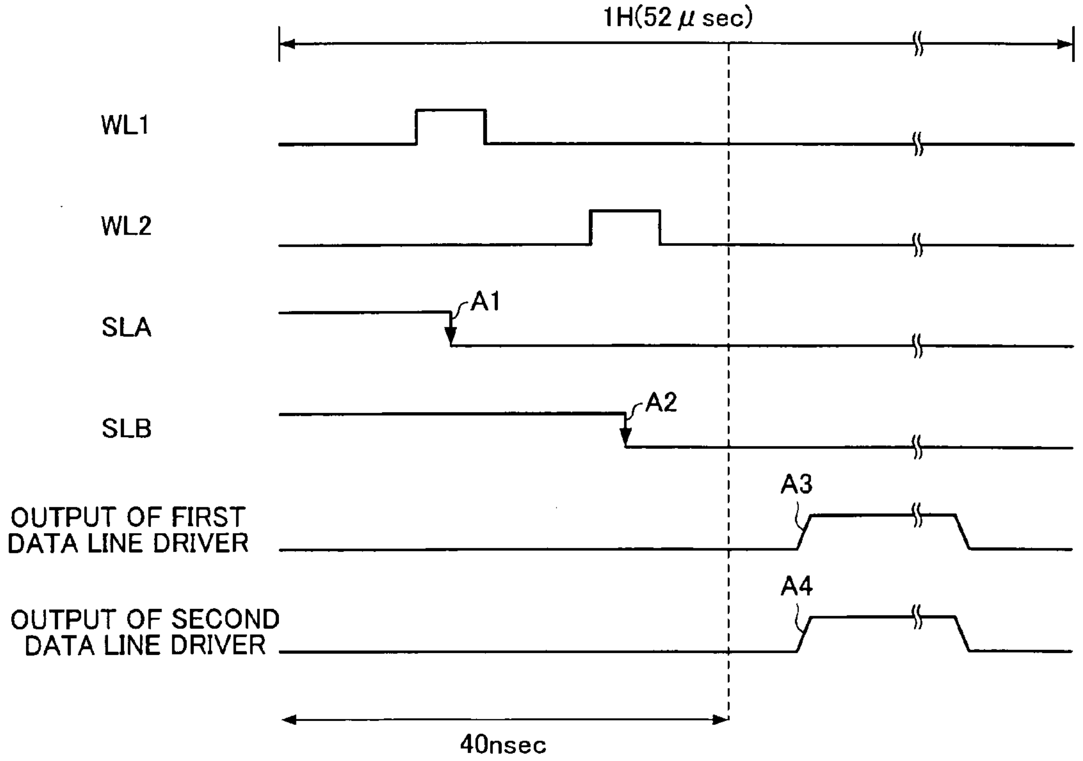

In more detail, the wordlines WL1 and WL2 are selected in the 1H period as shown in FIG. 11B, for example. Specifically, the wordlines are selected twice in the 1H period. A latch signal SLA falls at a timing A1. The latch signal SLA is supplied to the data line driver 100A, for example. The data line driver 100A latches M-bit data supplied from the RAM 200 in response to the falling edge of the latch signal SLA, for example.

A latch signal SLB falls at a timing A2. The latch signal SLB is supplied to the data line driver 100B, for example. The data line driver 100B latches M-bit data supplied from the RAM 200 in response to the falling edge of the latch signal SLB, for example.

Figure 12:
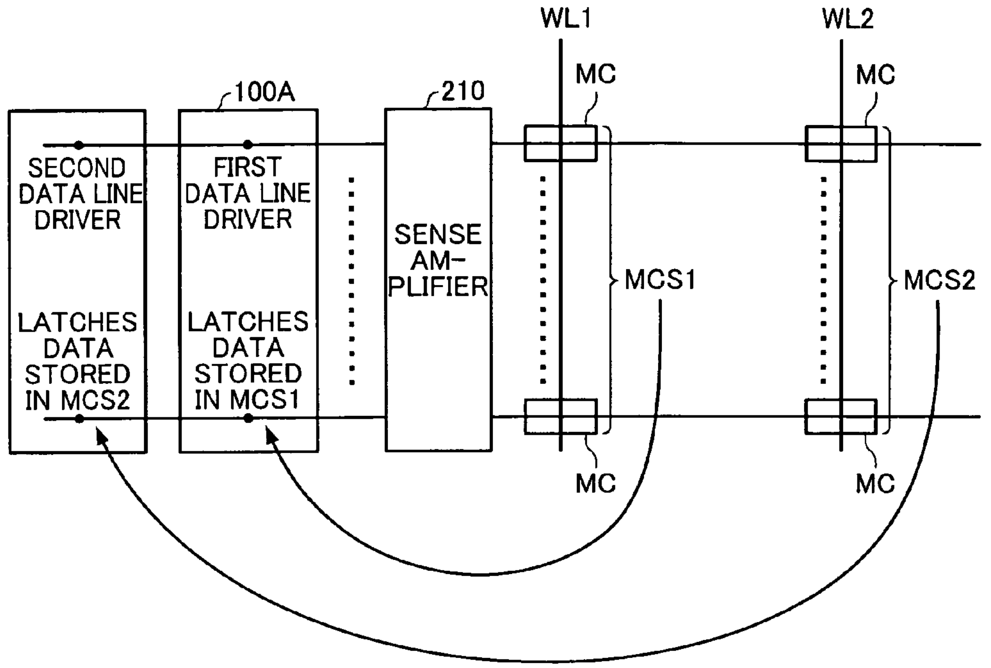
FIG. 12 is a diagram illustrative of data latching of a divided data line driver according to the embodiment.

In more detail, data stored in a memory cell group MCS1 (memory cells) is supplied to the data line drivers 100A and 100B through a sense amplifier circuit 210 upon selection of the wordline WL1, as shown in FIG. 12. However, since the latch signal SLA falls in response to the selection of the wordline VVL1, the data stored in the memory cell group MCS1 (M memory cells) is latched by the data line driver 100A.

Upon selection of the wordline WL2, data stored in a memory cell group MCS2 (M memory cells) is supplied to the data line drivers 100A and 100B through the sense amplifier circuit 210. The latch signal SLB falls in response to the selection of the wordline WL2. Therefore, the data stored in the memory cell group MCS2 (M memory cells) is latched by the data line driver 100B.

For example, when M is set at 540 bits, 540-bit data (M=540) is latched by each of the data line drivers 100A and 100B, since the data is read twice in the 1H period. Specifically, 1080-bit data in total is latched by the data line driver 100 so that 1080 bits necessary for the above-described example can be latched in the 1H period. Therefore, the amount of data necessary in the 1H period can be latched, and the length RY of the RAM 200 can be approximately halved. This enables the block width ICY of the display driver 20 to be reduced, whereby manufacturing cost of the display driver 20 can be reduced.

FIGS. 11A and 11B illustrate an example of reading data twice in the 1H period. However, the invention is not limited thereto. For example, data may be read four or more times in the 1H period. When reading data four times, the data line driver 100 may be divided into four blocks so that the length RY of the RAM 200 can be further reduced. In this case, M may be set at 270 in the above-described example, and 270-bit data is latched by each of the four divided data line drivers.

Specifically, 1080 bits of data necessary in the 1H period can be supplied while reducing the length RY of the RAM 200 by approximately ¼.

The outputs of the data line drivers 100A and 100B may be caused to rise based on control by using a data line enable signal (not shown) or the like as indicated by A3 and A4 shown in FIG. 11B, or the data latched by the data line drivers 100A and 100B at the timings A1 and A2 may be directly output to the data lines. An additional latch circuit may be provided to each of the data line drivers 100A and 100B, and voltages based on the data latched at the timings A1 and A2 may be output in the next 1H period. This enables the number of readings in the 1H period to be increased without causing the image quality to deteriorate.

When the number of pixels PY is 320 (the number of scan lines of the display panel 10 is 320) and 60 frames are displayed within one second, the 1H period is about 52 μsec as shown in FIG. 11B. The 1H period is calculated as indicated by "1 sec÷60 frames÷320≈52 μsec". As shown in FIG. 11B, the wordlines are selected within about 40 nsec. Specifically, since the wordlines are selected (data is read from the RAM 200) a plurality of times within a period sufficiently shorter than the 1H period, deterioration of the image quality of the display panel 10 does not occur.

The value M can be obtained by using the following equation. BNK indicates the number of BANKs, N indicates the number of readings in the 1H period, and G indicates the number of grayscale bits. The number of pixels PX×3 means the number of pixels DN corresponding to the data lines of the display panel 10.

$$M = \frac{PX \times 3 \times G}{BNK \times N}$$

In the embodiment, the sense amplifier circuit 210 has a latch function. However, the invention is not limited thereto. For example, the sense amplifier circuit 210 need not have a latch function.

2.4 Subdivision of Data Line Driver

Figure 13:
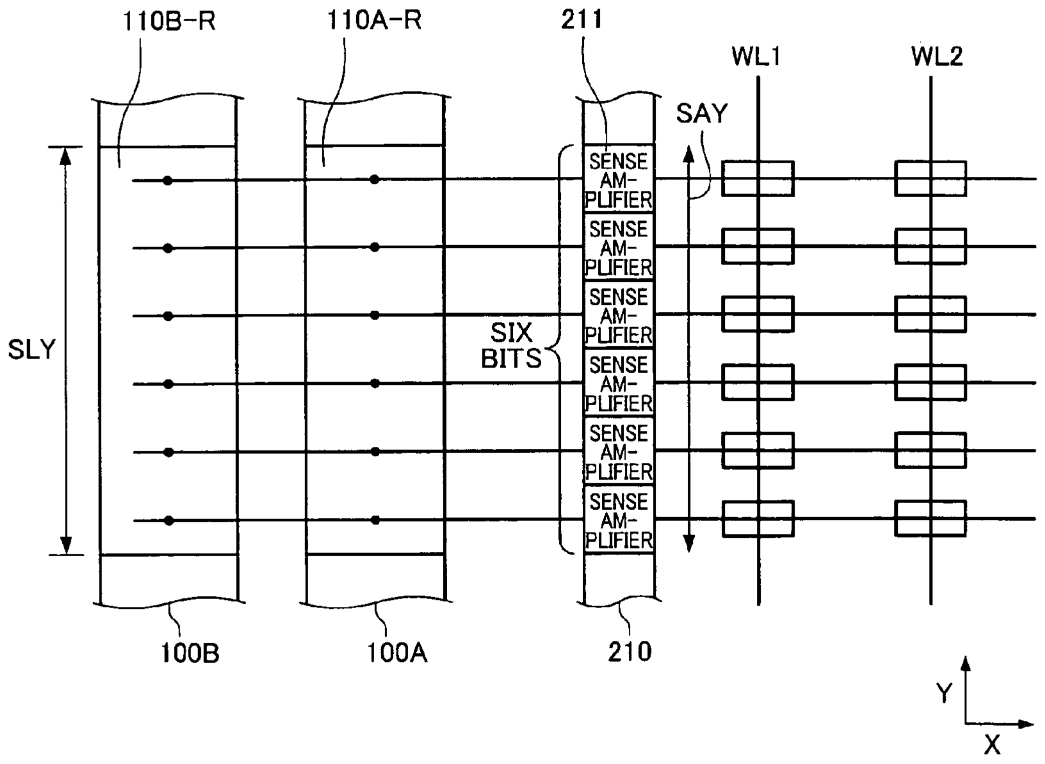
FIG. 13 is a diagram showing the relationship between the data line driver cells and sense amplifiers according to the embodiment.

FIG. 13 is a diagram illustrative of the relationship between the RAM 200 and the data line driver 100 for the R subpixel among the subpixels which make up one pixel as an example.

When the grayscale G bits of each subpixel are set at six bits (64 grayscales), 6-bit data is supplied from the RAM 200 to data line driver cells 110A-R and 110B-R for the R subpixel. In order to supply the 6-bit data, six sense amplifiers 211 among the sense amplifiers 211 included in the sense amplifier circuit 210 of the RAM 200 correspond to each data line driver cell 110, for example.

For example, it is necessary that a length SCY of the data line driver cell 110A-R in the direction Y be within a length SAY of the six sense amplifiers 211 in the direction Y. Likewise, it is necessary that the length of each data line driver cell in the direction Y be within the length SAY of the six sense amplifiers 211. When the length SCY cannot be set within the length SAY of the six sense amplifiers 211, the length of the data line driver 100 in the direction Y becomes greater than the length RY of the RAM 200, whereby the layout efficiency is decreased.

The size of the RAM 200 has been reduced in view of the process, and the sense amplifier 211 is also small. As shown in FIG. 7, a plurality of circuits are provided in the data line driver cell 110. In particular, it is difficult to design the DAC 120 and the latch circuit 130 to have a small circuit size. Moreover, the size of the DAC 120 and the latch circuit 130 is increased as the number of bits input is increased. Specifically, it may be difficult to set the length SCY within the total length SAY of the six sense amplifiers 211.

Figure 14:
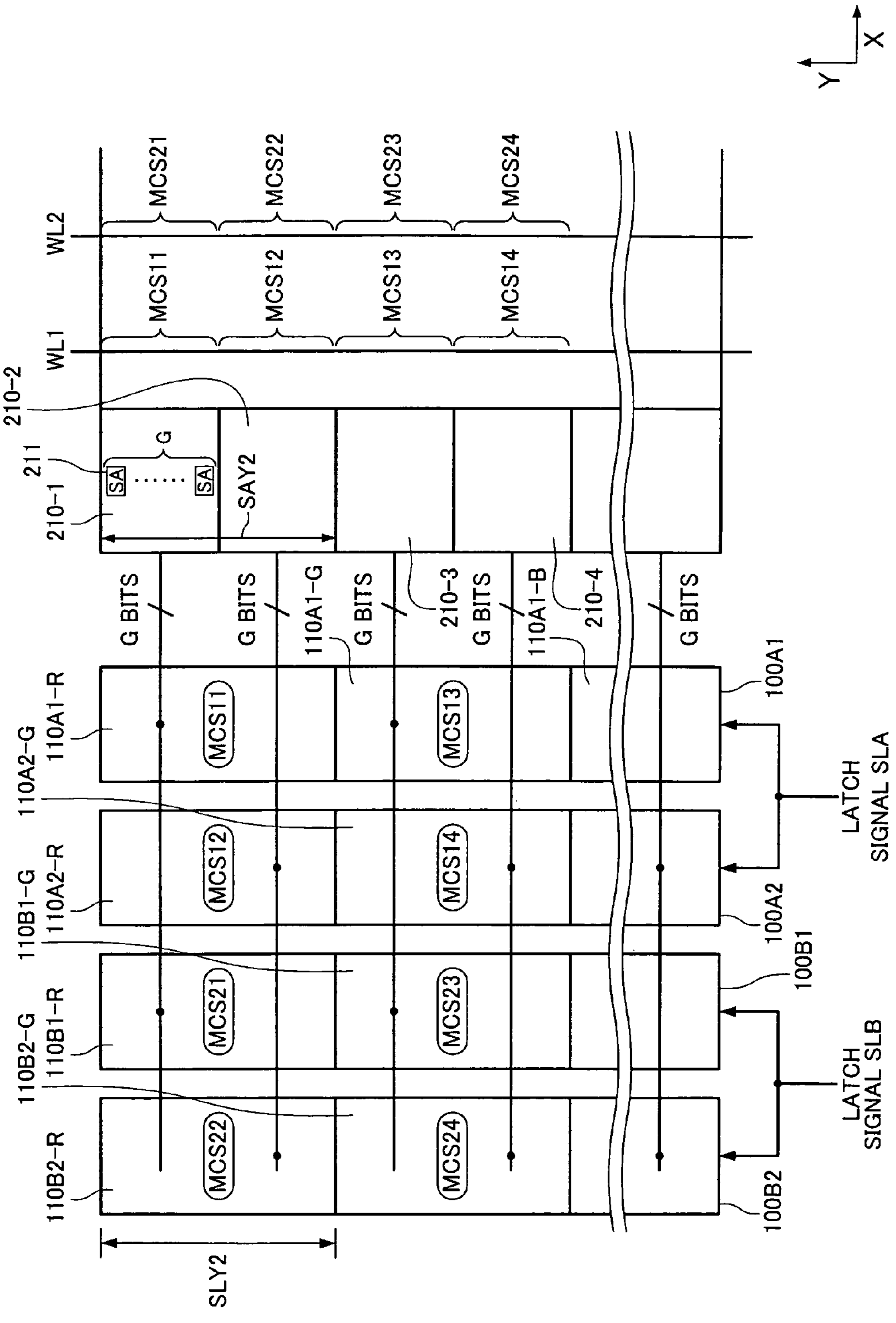
FIG. 14 is another configuration example of the divided data line drivers according to the embodiment.

In the embodiment, the data line drivers 100A and 100B divided by the number of readings N in the 1H period may be further divided into S (S is an integer larger than one) blocks and stacked in the direction X. FIG. 14 shows a configuration example in which each of the data line drivers 100A and 100B is divided into two (S=2) blocks and stacked in the RAM 200 set to read data twice (N=2) in the 1H period. FIG. 14 shows the configuration example of the RAM 200 set to read data twice. However, the invention is not limited to the configuration example shown in FIG. 14. When the RAM 200 is set to read data four times (N=4), the data line driver is divided into eight (4×2) blocks in the direction X, for example.

As shown in FIG. 14, the data line drivers 100A and 100B shown in FIG. 13 are respectively divided into data line drivers 100A1 (first subdivided data line driver in a broad sense) and 100A2 (second or Sth subdivided data line driver in a broad sense) and data line drivers 100B1 (first subdivided data line driver in a broad sense) and 100B2 (second or Sth subdivided data line driver in a broad sense). The length of a data line driver cell 110A1-R (R data line driver cell in a broad sense) or the like in the direction Y is set at SCY2. In FIG. 14, the length SCY2 is set within a length SAY2 in the direction Y when G×2 sense amplifiers 211 are arranged. Specifically, since the acceptable length in the direction Y is increased in comparison with FIG. 13 when forming each data line driver cell 110, efficient design in view of the layout can be achieved.

The operation of the configuration shown in FIG. 14 is described below. When the wordline WL1 is selected, M-bit data in total is supplied to at least one of the data line drivers 100A1, 100A2, 100B1, and 100B2 through the sense amplifier blocks 210-1, 210-2, 210-3, and 210-4, for example. G-bit data output from the sense amplifier block 210-1 is supplied to the data line driver cells 110A1-R and 110B1-R (R data line driver cells in a broad sense), for example. G-bit data output from the sense amplifier block 210-2 is supplied to the data line driver cells 110A2-R (R data line driver cell in a broad sense) and 110B2-R (R data line driver cell in a broad sense), for example. In this case, M/(G×S) data line driver cells 110 are provided in each of the subdivided data line drivers 100A1, 100A2, 100B1, and 100B2.

The latch signal SLA (first latch signal in a broad sense) falls in response to the selection of the wordline WL1 in the same manner as in the timing chart shown in FIG. 11B. The latch signal SLA is supplied to the data line driver 100A1 including the data line driver cell 110A1-R and the data line driver 100A2 including the data line driver cell 110A2-R. Therefore, G-bit data (data stored in the memory cell group MCS11) output from the sense amplifier block 210-1 in response to the selection of the wordline WL1 is latched by the data line driver cell 110A1-R. Likewise, G-bit data (data stored in the memory cell group MCS12) output from the sense amplifier block 210-2 in response to the selection of the wordline WL1 is latched by the data line driver cell 110A2-R.

The above description also applies to the sense amplifier blocks 210-3 and 210-4. Specifically, data stored in the memory cell group MCS13 is latched by the data line driver cell 110A1-G (G data line driver cell in a broad sense), and data stored in the memory cell group MCS14 is latched by the data line driver cell 110A2-G (G data line driver cell in a broad sense).

When the wordline WL2 is selected, the latch signal SLB (second latch signal in a broad sense) falls in response to the selection of the wordline WL2. The latch signal SLB is supplied to the data line driver 100B1 including the data line driver cell 110B1-R and the data line driver 100B2 including the data line driver cell 110B2-R. Therefore, G-bit data (data stored in the memory cell group MCS21) output from the sense amplifier block 210-1 in response to the selection of the wordline WL2 is latched by the data line driver cell 110B1-R. Likewise, G-bit data (data stored in the memory cell group MCS22) output from the sense amplifier block 210-2 in response to the selection of the wordline WL2 is latched by the data line driver cell 110B2-R.

The above description also applies to the sense amplifier blocks 210-3 and 210-4 when the wordline WL2 is selected. Specifically, data stored in the memory cell group MCS23 is latched by the data line driver cell 110B1-G and data stored in the memory cell group MCS24 is latched by the data line driver cell 110B2-G A data line driver cell 110A1-B is a B data line driver cell which latches B subpixel data.

The R data line driver cell, the G data line driver cell, and the B data line driver cell are arranged in each of the data line drivers 100A and 100B along the direction Y (second direction in a broad sense).

Figure 15A:
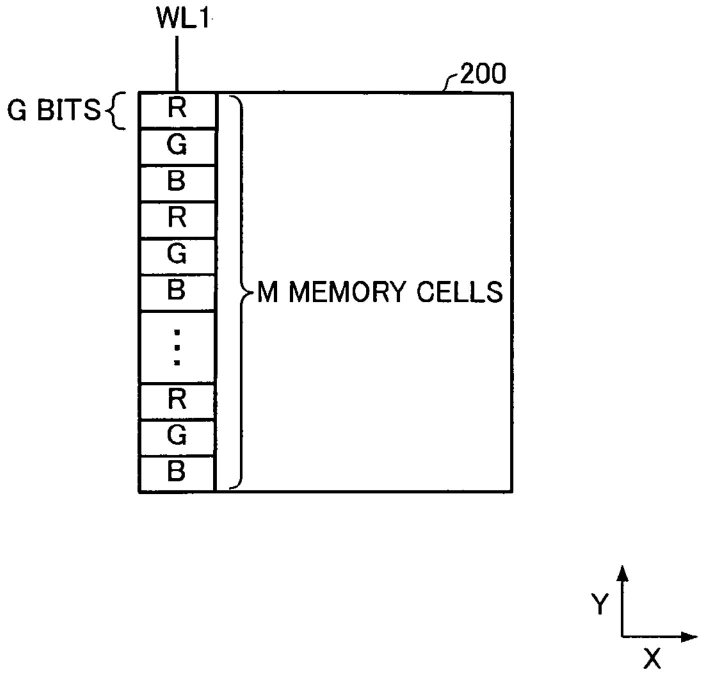
FIGS. 15A and 15B are diagrams illustrative of an arrangement of data stored in the RAM block.
Figure 15B:
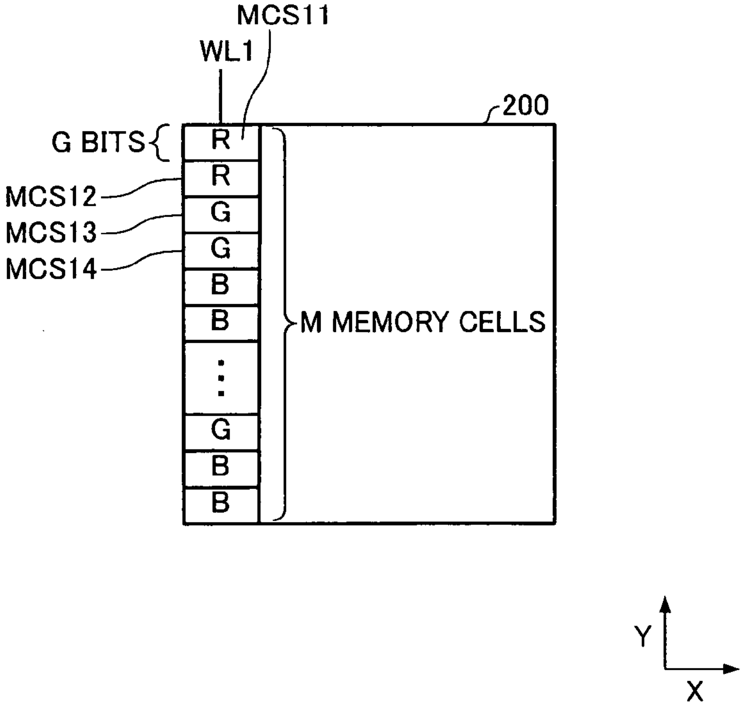

FIG. 15B shows data stored in the RAM 200 when the data line drivers 100A and 100B are divided as described above. As shown in FIG. 15B, data in the sequence R subpixel data, R subpixel data, G subpixel data, G subpixel data, B subpixel data, B subpixel data, . . . is stored in the RAM 200 along the direction Y. In the configuration as shown in FIG. 13, data in the sequence R subpixel data, G subpixel data, B subpixel data, R subpixel data, . . . is stored in the RAM 200 along the direction Y, as shown in FIG. 15A.

In FIG. 13, the length SAY is illustrated as the length of the six sense amplifiers 211. However, the invention is not limited thereto. For example, the length SAY corresponds to the length of eight sense amplifiers 211 when the grayscale is eight bits.

Figure 16:
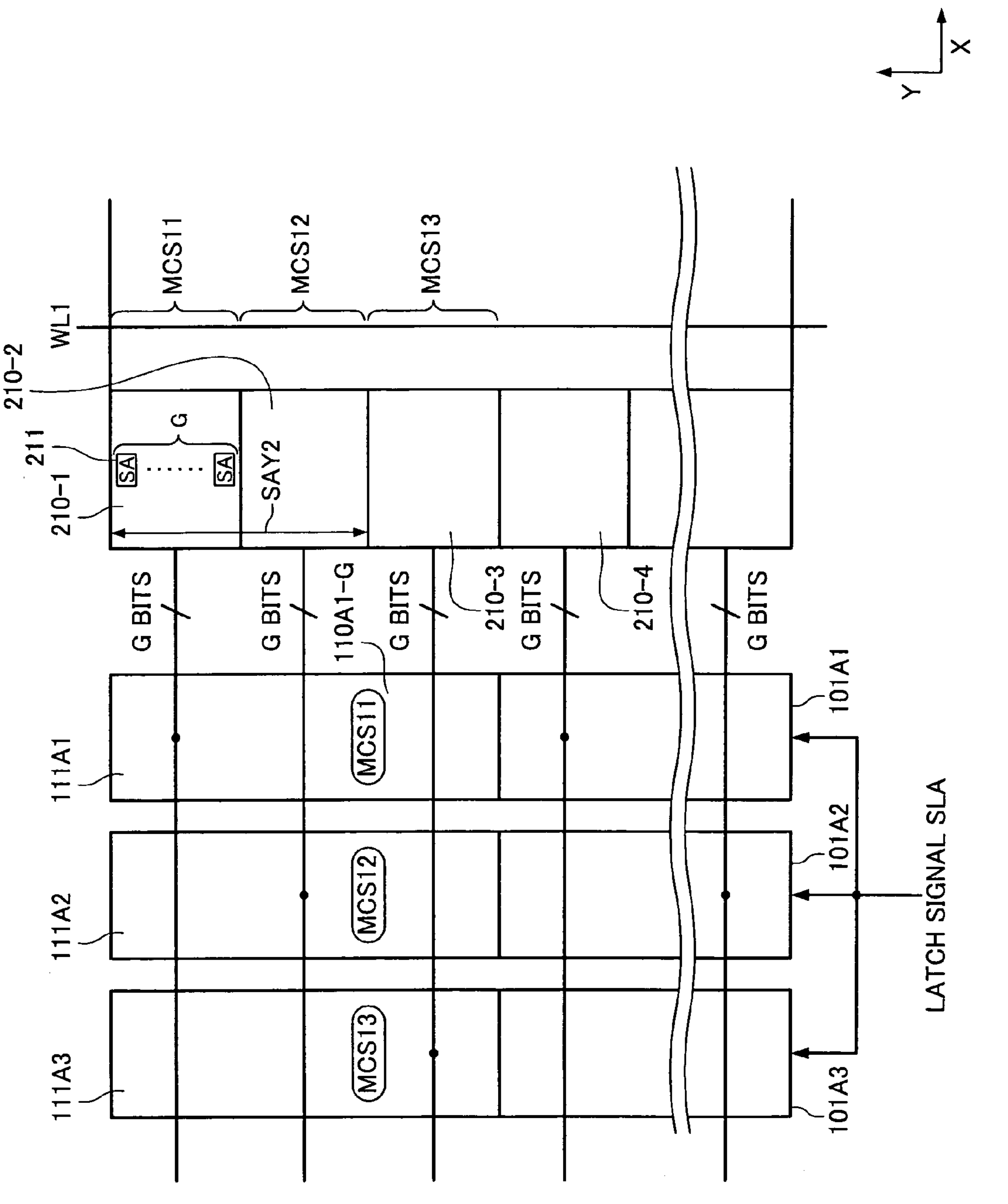
FIG. 16 is another configuration example of the divided data line drivers according to the embodiment.

FIG. 14 illustrates the configuration in which the data line drivers 100A and 100B are divided into two (S=2) blocks as an example. However, the invention is not limited thereto. For example, the data line drivers 100A and 100B may be divided into three blocks or four blocks. When the data line driver 100A is divided into three blocks, the same latch signal SLA may be supplied to the three divided blocks, for example. As a modification of the number of divisions k equal to the number of readings in the 1H period, when the data line driver is divided into three (k=3) blocks, the divided blocks may be respectively used as an R subpixel data driver, G subpixel data driver, and B subpixel data driver. This configuration is shown in FIG. 16. FIG. 16 shows three divided data line drivers 101A1 (first subdivided data line driver in a broad sense), 101A2 (second subdivided data line driver in a broad sense), and 101A3 (third subdivided data line driver in a broad sense). The data line driver 101A1 includes a data line driver cell 111A1, the data line driver 101A2 includes a data line driver cell 111A2, and the data line driver 101A3 includes a data line driver cell 111A3.

The latch signal SLA falls in response to selection of the wordline WL1. The latch signal SLA is supplied to the data line drivers 101A1, 100A2, and 101A3 in the same manner as described above.

According to this configuration, data stored in the memory cell group MCS11 is stored in the data line driver cell 111A1 as R subpixel data upon selection of the wordline WL1, for example. Likewise, data stored in the memory cell group MCS12 is stored in the data line driver cell 111A2 as G subpixel data, and data stored in the memory cell group MCS13 is stored in the data line driver cell 111A3 as B subpixel data, for example.

Therefore, the data written into the RAM 200 can be arranged in the order of R subpixel data, G subpixel data, and B subpixel data along the direction Y, as shown in FIG. 15A. In this case, the data line drivers 101A1, 101A2, and 101A3 may be further divided into k blocks.

3. RAM 3.1 Configuration of Memory Cell

Figure 17A:
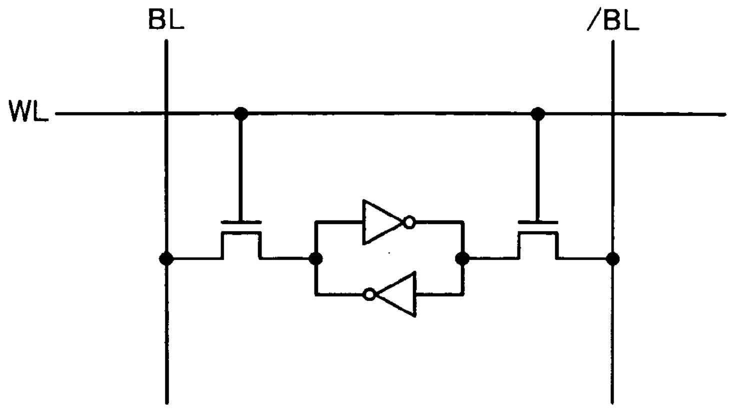
FIGS. 17A and 17B are diagrams showing a configuration of a memory cell according to the embodiment.
Figure 17B:
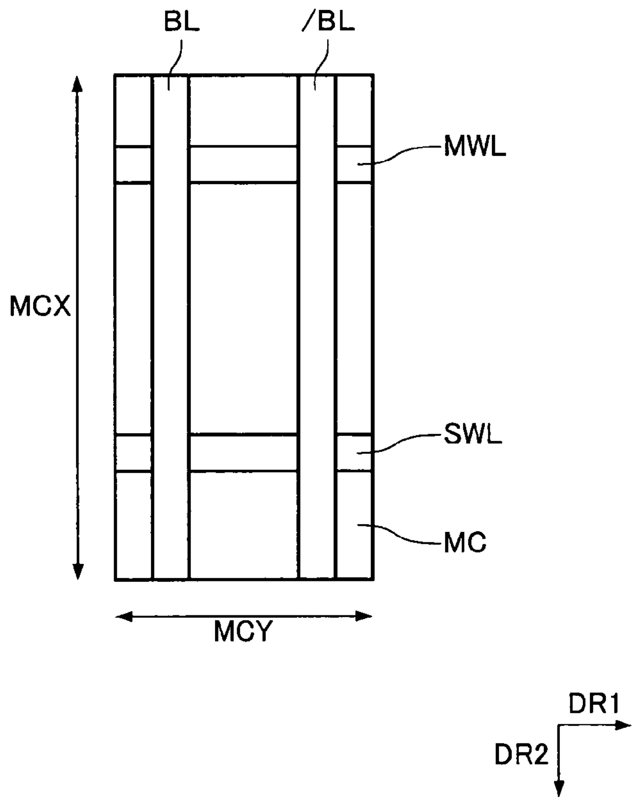

Each memory cell MC may be formed by a static random access memory (SRAM), for example. FIG. 17A shows an example of a circuit of the memory cell MC. FIG. 17B shows an example of the layout of the memory cell MC.

As shown in FIG. 17B, the memory cell MC includes a main-wordline MWL and a sub-wordline SWL. The main-wordline MWL and the sub-wordline SWL are formed to extend along the direction DR1. The memory cell MC includes a bitline BL and a bitline/BL. The bitline BL and the bitline/BL are formed to extend along the direction DR2. In the embodiment, the memory cell MC is formed by using five metal interconnect layers, for example. The bitlines BL and/BL are formed in the third metal interconnect layer, and the main-wordline MWL is formed in the second metal interconnect layer, for example. The sub-wordline SWL is formed by a conductor such as polysilicon, for example.

In the memory cell MC, the length MCX along the bitlines BL and/BL is sufficiently greater than the length MCY along the main-wordline MWL and the sub-wordline SWL. In the embodiment, the memory cell MC having such a layout can be used for the RAM 200. However, the invention is not limited thereto. For example, the length MCY of the memory cell MC may be greater than the length MCX.

In the embodiment, the main-wordline MWL and the sub-wordline SWL are electrically connected at predetermined locations. This enables the resistance of the sub-wordline SWL to be reduced by using the main-wordline MWL which is the metal interconnect. In the embodiment, the main-wordline MWL and the sub-wordline SWL may be regarded as one wordline WL.

3.2. Common Use of Sense Amplifier

Figure 18A:
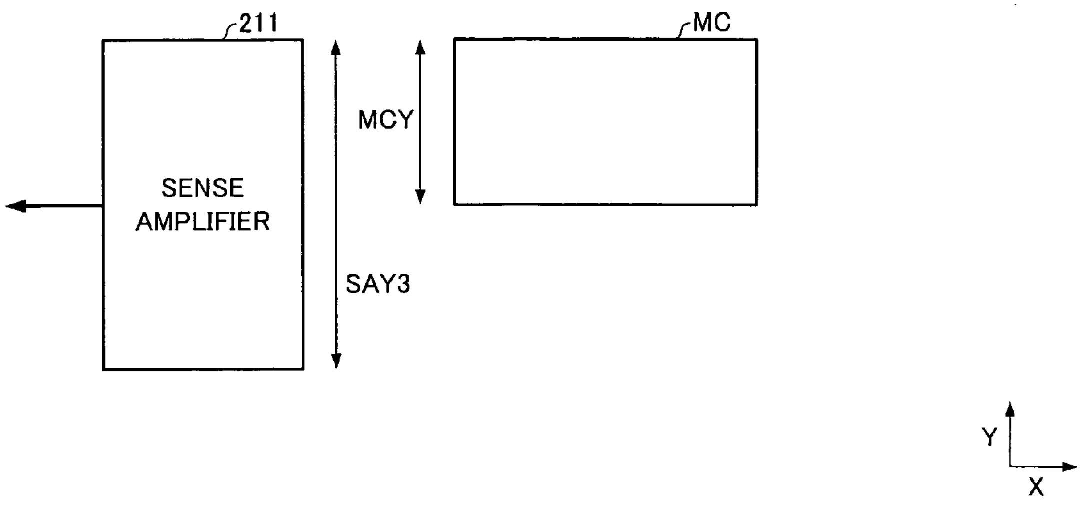
FIG. 18A is a diagram showing the relationship between the sense amplifier and the memory cell according to the embodiment.

As shown in FIG. 18A, the length SAY3 of the sense amplifier 211 in the direction Y is sufficiently greater than the length MCY of the memory cell MC. Therefore, the layout in which one memory cell MC is associated with one sense amplifier 211 when selecting the wordline WL is inefficient.

Figure 18B:
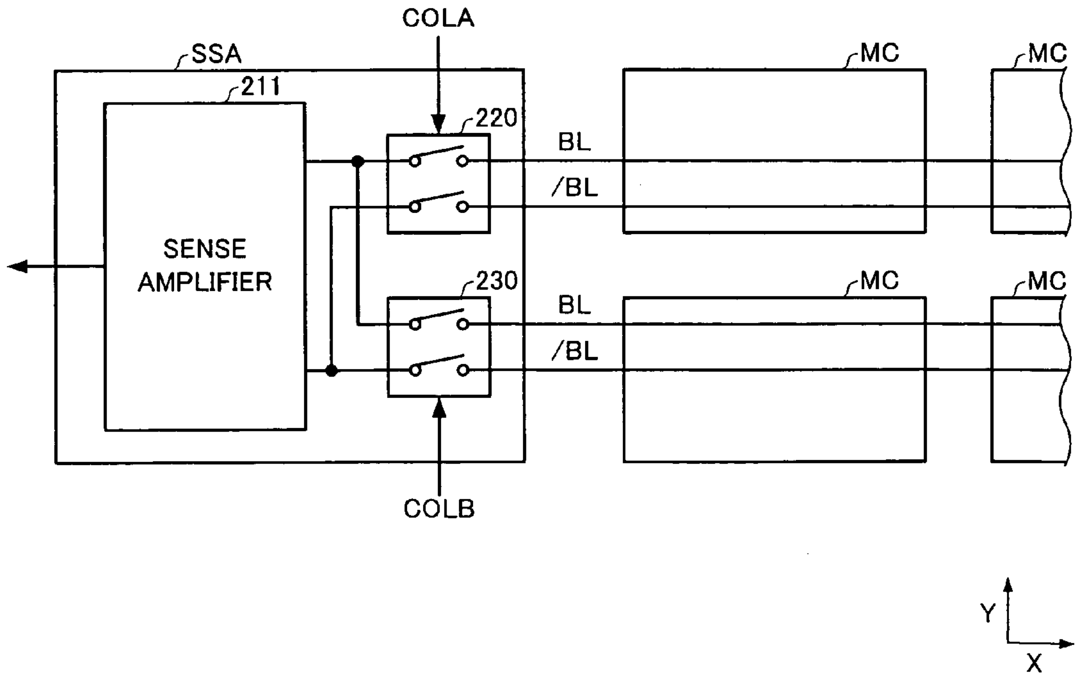
FIG. 18B is a diagram showing a selective sense amplifier SSA according to the embodiment.

In the embodiment, such memory cells MC can be efficiently arranged. As shown in FIG. 18B, a plurality of (e.g. two) memory cells MC are associated with one sense amplifier 211 when selecting the wordline WL. This enables the memory cells MC to be efficiently arranged in the RAM 200 irrespective of the difference between the length SAY3 of the sense amplifier 211 and the length MCY of the memory cell MC.

In FIG. 18B, a selective sense amplifier SSA includes the sense amplifier 211, a switch circuit 220, and a switch circuit 230. The selective sense amplifier SSA is connected with two pairs of bitlines BL and/BL, for example.

The switch circuit 220 connects one pair of bitlines BL and/BL with the sense amplifier 211 based on a select signal COLA (sense amplifier select signal in a broad sense). The switch circuit 230 connects the other pair of bitlines BL and/BL with the sense amplifier 211 based on a select signal COLB. The signal levels of the select signals COLA and COLB are controlled exclusively, for example. In more detail, when the select signal COLA is set to be a signal which sets the switch circuit 220 to active, the select signal COLB is set to be a signal which sets the switch circuit 230 to inactive.

Specifically, the selective sense amplifier SSA selects 1-bit data from 2-bit data supplied through the two pairs of bitlines BL and/BL, and outputs the selected data, for example.

Figure 19:
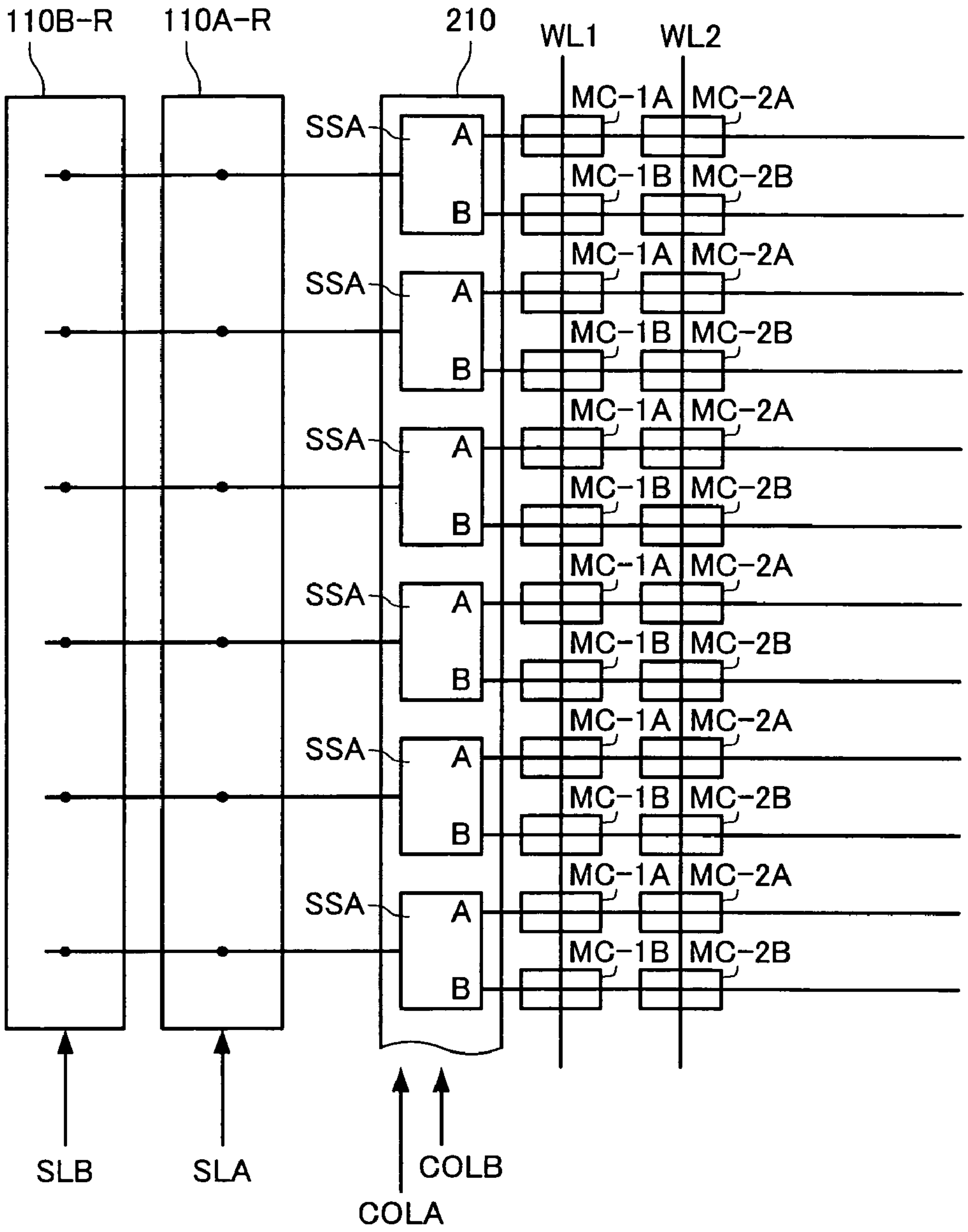
FIG. 19 is a diagram showing the divided data line drivers and the selective sense amplifiers according to the embodiment.
Figure 20:
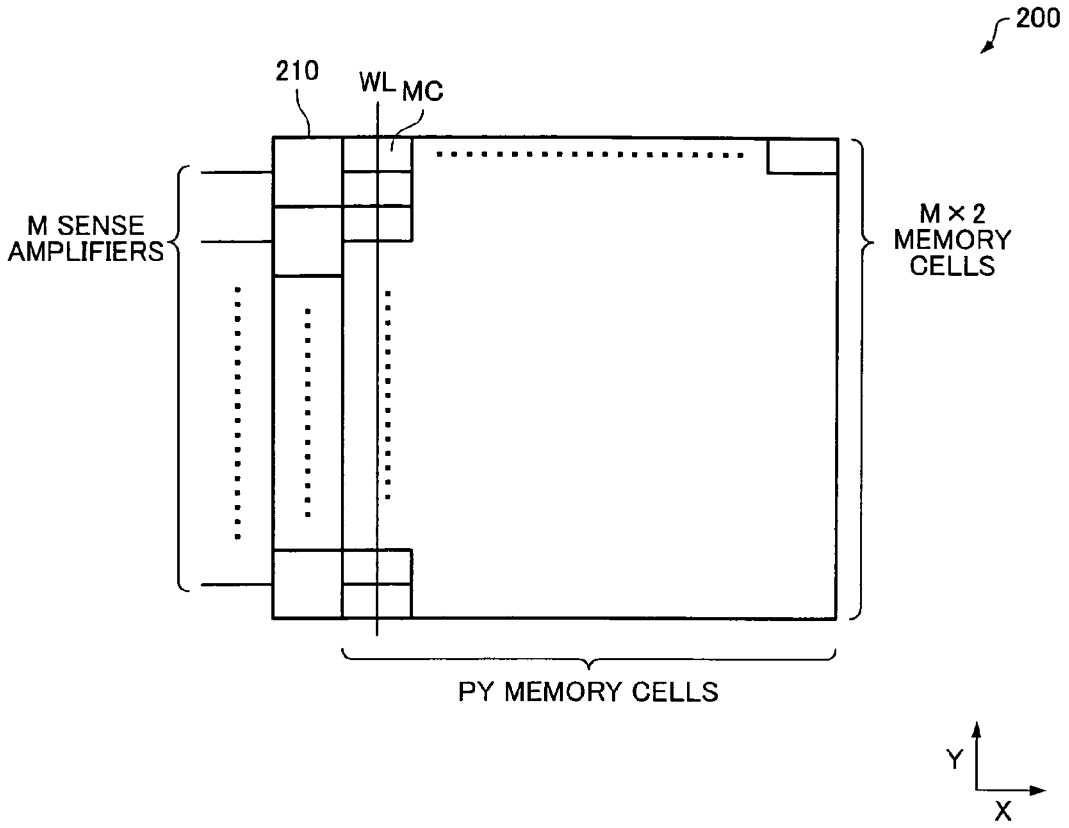
FIG. 20 is an arrangement example of the memory cells according to the embodiment.

FIG. 19 shows the RAM 200 including the selective sense amplifier SSA. FIG. 19 shows a configuration in which data is read twice (N times in a broad sense) in the 1H period and the grayscale G bits are six bits as an example. In this case, M selective sense amplifiers SSA are provided in the RAM 200 as shown in FIG. 20. Therefore, data supplied to the data line driver 100 by one wordline selection is M bits in total. On the other hand, M×2 memory cells MC are arranged in the RAM 200 shown in FIG. 20 in the direction Y The memory cells MC in the same number as the number of pixels PY are arranged in the direction X. When data is read twice in the 1H period as shown in FIG. 13, the number of memory cells MC arranged in the RAM 200 in the direction X is "number of pixels PY×number of readings (2)". On the other hand, in the RAM 200 shown in FIG. 20, since the two pairs of bitlines BL and/BL are connected with the selective sense amplifier SSA, it suffices that the number of memory cells MC arranged in the RAM 200 in the direction X be the same as the number of pixels PY.

This prevents an increase in the size of the RAM 200 in the direction X, even if the length MCX of the memory cell MC is greater than the length MCY 3.3. Operation The operation of the RAM 200 shown in FIG. 19 is described below. As the read control method for the RAM 200, two methods can be given, for example. One of the two methods is described below using timing charts shown in FIGS. 21A and 21B.

Figure 21A:
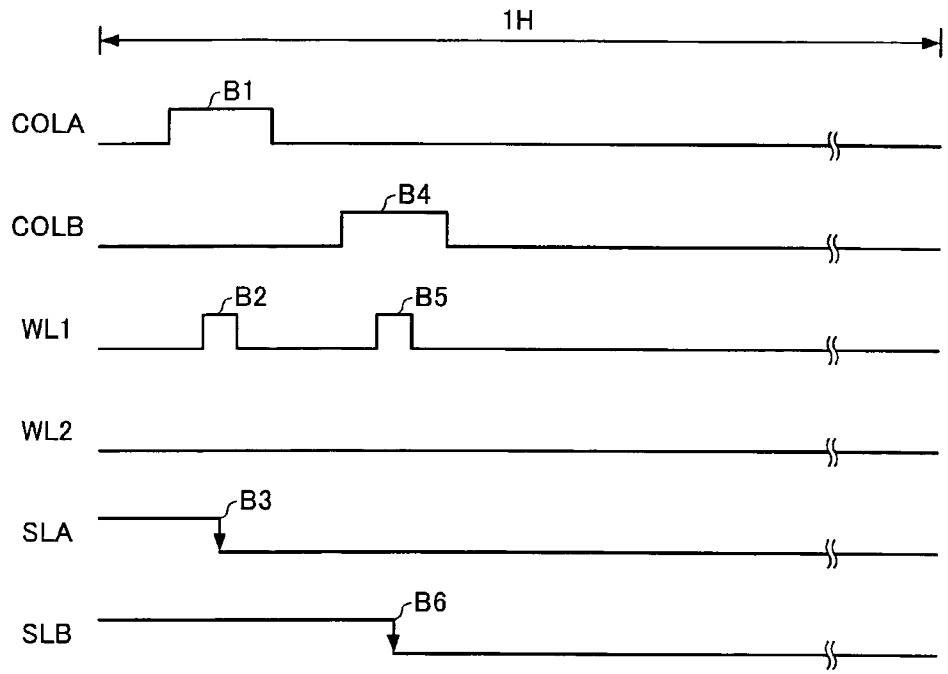
FIGS. 21A and 21B are timing charts showing the operation of the integrated circuit device according to the embodiment.

The select signal COLA is set to active at a timing B1 shown in FIG. 21A, and the wordline WL1 is selected at a timing B2. In this case, since the select signal COLA is active, the selective sense amplifier SSA detects and outputs data stored in the A-side memory cell MC, that is, the memory cell MC-1A. When the latch signal SLA falls at a timing B3, the data line driver cell 110A-R latches the data stored in the memory cell MC-1A.

The select signal COLB is set to active at a timing B4, and the wordline WL1 is selected at a timing B5. In this case, since the select signal COLB is active, the selective sense amplifier SSA detects and outputs data stored in the B-side memory cell MC, that is, the memory cell MC-1B. When the latch signal SLB falls at a timing B6, the data line driver cell 110B-R latches the data stored in the memory cell MC-1B. In FIG. 21A, the wordline WL1 is selected when reading data twice.

The data latch operation of the data line driver 100 by reading data twice in the 1H period is completed in this manner.

Figure 21B:
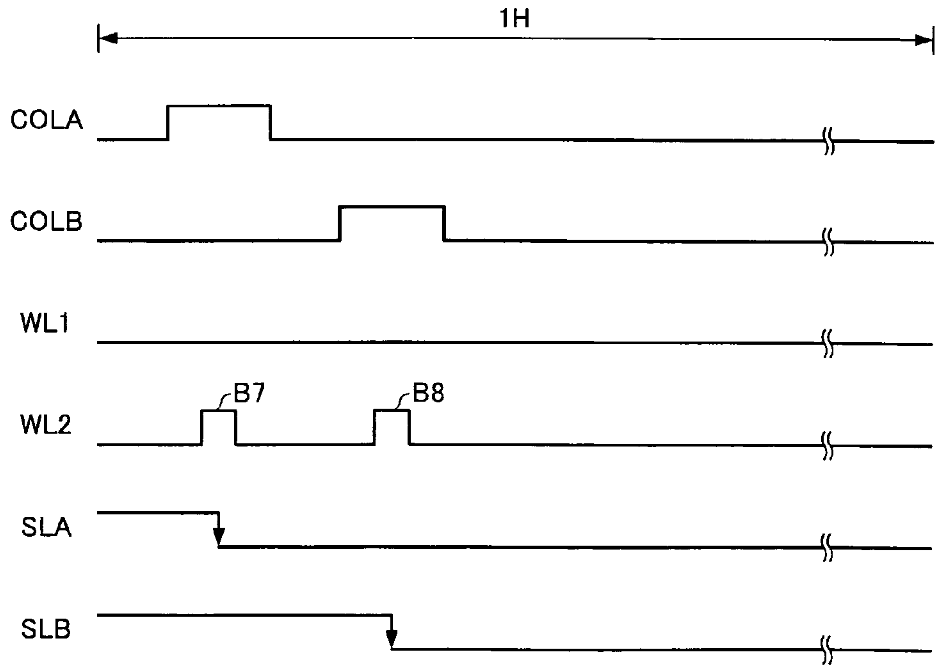

FIG. 21B shows a timing chart when the wordline WL2 is selected. The operation is similar to the above-described operation. As a result, when the wordline WL2 is selected as indicated by B7 and B8, data stored in the memory cell MC-2A is latched by the data line driver cell 110A-R, and data stored in the memory cell MC-2B is latched by the data line driver cell 110B-R.

The data latch operation of the data line driver 100 by reading data twice in the 1H period differing from the 1H period shown in FIG. 21A is completed in this manner.

Figure 22:
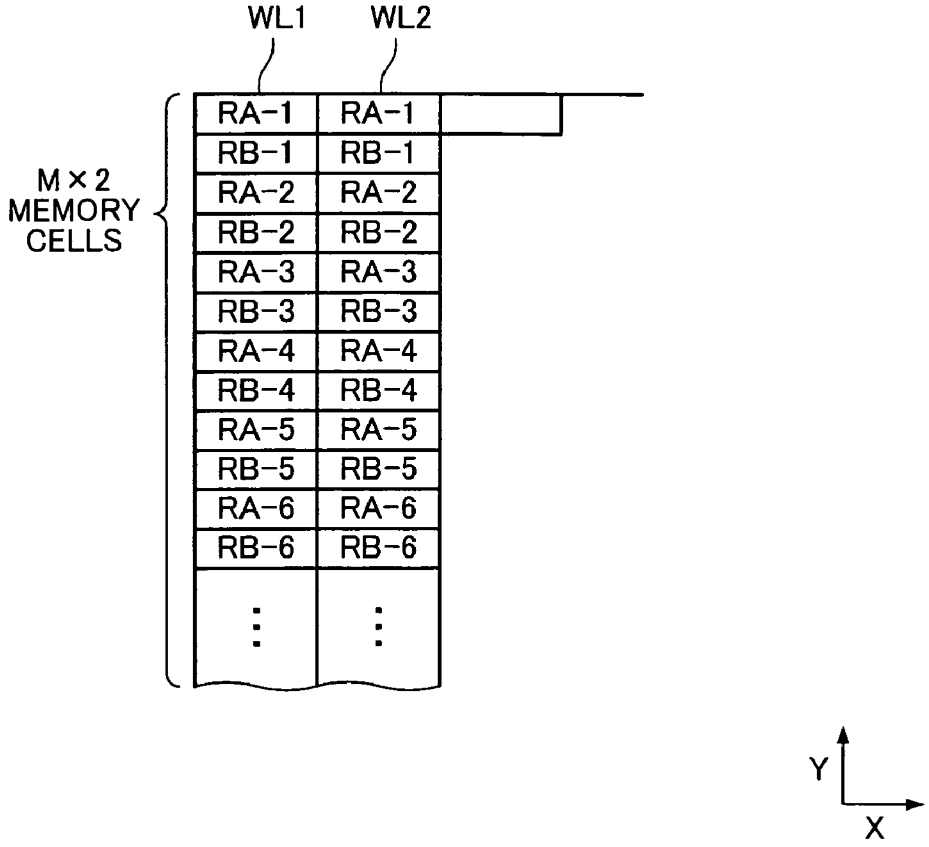
FIG. 22 is another arrangement example of data stored in the RAM block according to the embodiment.

According to such a read method, data is stored in each memory cell MC of the RAM 200 as shown in FIG. 22. For example, data RA-1 to RA-6 is 6-bit R pixel data to be supplied to the data line driver cell 110A-R, and data RB-1 to RB-6 is 6-bit R pixel data to be supplied to the data line driver cell 110B-R.

As shown in FIG. 22, the data RA-1 (data latched by the data line driver 100A), the data RB-1 (data latched by the data line driver 100B), the data RA-2 (data latched by the data line driver 100A), the data RB-2 (data latched by the data line driver 100B), the data RA-3 (data latched by the data line driver 100A), the data RB-3 (data latched by the data line driver 100B), . . . are sequentially stored in the memory cells MC corresponding to the wordline WL1 along the direction Y, for example. Specifically, (data latched by the data line driver 100A) and (data latched by the data line driver 100B) are alternately stored in the RAM 200 along the direction Y.

In the read method shown in FIGS. 21A and 21B, data is read twice in the 1H period, and the same wordline is selected in the 1H period.

The above description discloses that each selective sense amplifier SSA receives data from two of the memory cells MC selected by one wordline selection. However, the invention is not limited thereto. For example, each selective sense amplifier SSA may receive N-bit data from N memory cells MC of the memory cells MC selected by one wordline selection. In this case, the selective sense amplifier SSA selects 1-bit data received from a first memory cell MC of first to Nth memory cells MC (N memory cells MC) upon first selection of a single wordline. The selective sense amplifier SSA selects 1-bit data received from the Kth memory cell MC upon Kth ($1 \leqq K \leqq N$) selection of the wordline.

As a modification of FIGS. 18A and 18B, J wordlines (J is an integer larger than one) WL, each selected L times in the 1H period, may be selected so that the number of times data is read from the RAM 200 in the 1H period is "L×J". Specifically, when L=2 and J=2, the four wordline selections shown in FIGS. 18A and 18B are performed in a single horizontal scan period 1H. Specifically, data is read four (N=4) times by selecting the wordline WL1 twice and selecting the wordline WL2 twice in the 1H period.

The other control method is described below with reference to FIGS. 23A and 23B.

Figure 23A:
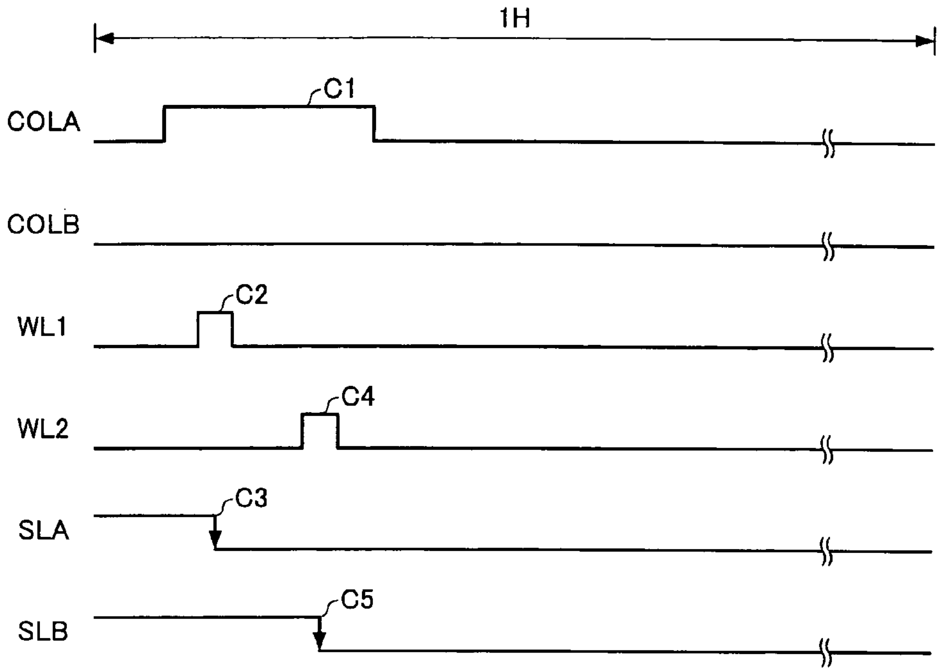
FIGS. 23A and 23B are timing charts showing another operation of the integrated circuit device according to the embodiment.

The select signal COLA is set to active at a timing C1 shown in FIG. 23A, and the wordline WL1 is selected at a timing C2. This causes the memory cells MC-1A and MC-1B shown in FIG. 19 to be selected. In this case, since the select signal COLA is active, the selective sense amplifier SSA detects and outputs data stored in the A-side memory cell MC (first memory cell in a broad sense), that is, the memory cell MC-1A. When the latch signal SLA falls at a timing C3, the data line driver cell 110A-R latches the data stored in the memory cell MC-1A.

The wordline WL2 is selected at a timing C4 so that the memory cells MC-2A and MC-2B are selected. In this case, since the select signal COLA is active, the selective sense amplifier SSA detects and outputs data stored in the A-side memory cell MC, that is, the memory cell MC-2A. When the latch signal SLB falls at a timing C5, the data line driver cell 110B-R latches the data stored in the memory cell MC-2A.

The data latch operation of the data line driver 100 by reading data twice in the 1H period is completed in this manner.

The read operation in the 1H period differing from the 1H period shown in FIG. 23A is described below with reference to FIG. 23B. The select signal COLB is set to active at a timing C6 shown in FIG. 23B, and the wordline WL1 is selected at a timing C7. This causes the memory cells MC-1A and MC-1B shown in FIG. 19 to be selected. In this case, since the select signal COLB is active, the selective sense amplifier SSA detects and outputs data stored in the B-side memory cell MC (one of the first to Nth memory cells differing from the first memory cell in a broad sense), that is, the memory cell MC-1B. When the latch signal SLA falls at a timing C8, the data line driver cell 110A-R latches the data stored in the memory cell MC-1B.

The wordline WL2 is selected at a timing C9 so that the memory cells MC-2A and MC-2B are selected. In this case, since the select signal COLB is active, the selective sense amplifier SSA detects and outputs data stored in the B-side memory cell MC, that is, the memory cell MC-2B. When the latch signal SLB falls at a timing C10, the data line driver cell 110B-R latches the data stored in the memory cell MC-2B.

The data latch operation of the data line driver 100 by reading data twice in the 1H period differing from the 1H period shown in FIG. 23A is completed in this manner.

Figure 23B:
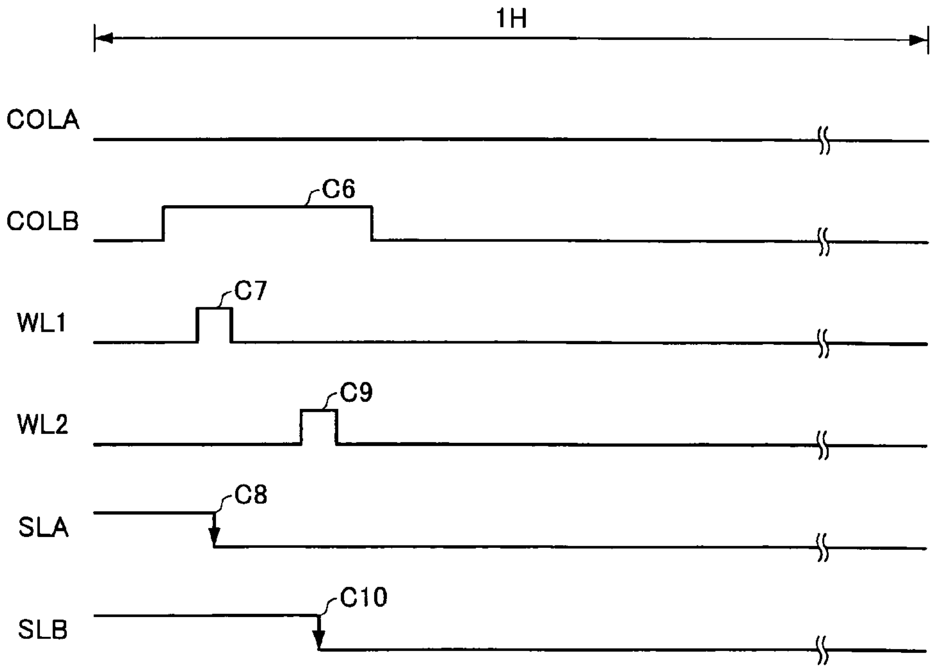
Figure 24:
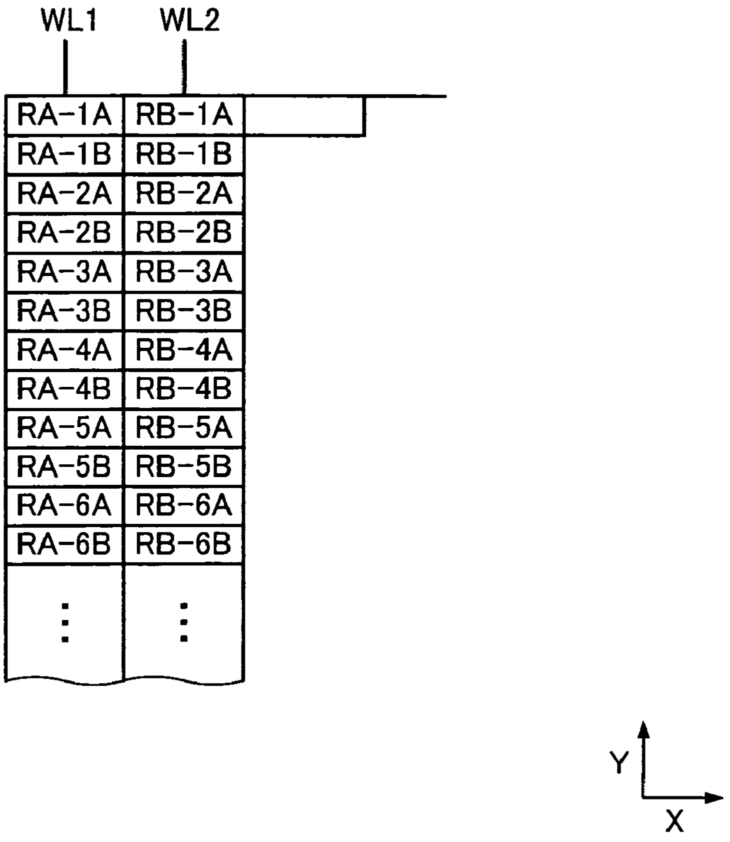
FIG. 24 is still another arrangement example of data stored in the RAM block according to the embodiment.

According to such a read method, data is stored in each memory cell MC of the RAM 200 as shown in FIG. 24. Data RA-1A to RA-6A and data RA-1B to RA-6B are 6-bit R subpixel data to be supplied to the data line driver cell 110A-R, for example. The data RA-1A to RA-6A is R subpixel data in the 1H period shown in FIG. 23A, and the data RA-1B to RA-6B is R subpixel data in the 1H period shown in FIG. 23B.

Data RB-1A to RB-6A and data RB-1B to RB-6B are 6-bit R subpixel data to be supplied to the data line driver cell 110B-R. The data RB-1A to RB-6A is R subpixel data in the 1H period shown in FIG. 23A, and the data RB-1B to RB-6B is R subpixel data in the 1H period shown in FIG. 23B.

As shown in FIG. 24, the data RA-1A (data latched by the data line driver 100A) and the data RB-1A (data latched by the data line driver 100B) are stored in the RAM 200 in that order along the direction X.

The data RA-1A (data latched by the data line driver 100A in the 1H period shown in FIG. 23A), the data RA-1B (data latched by the data line driver 100A in the 1H period shown in FIG. 23A), the data RA-2A (data latched by the data line driver 100A in the 1H period shown in FIG. 23A), the data RA-2B (data latched by the data line driver 100A in the 1H period shown in FIG. 23A), . . . are stored in the RAM 200 in that order along the direction Y. Specifically, the data latched by the data line driver 100A in one 1H period and the data latched by the data line driver 100A in another 1H period are alternately stored in the RAM 200 along the direction Y.

In the read method shown in FIGS. 23A and 23B, data is read twice in the 1H period, and different wordlines are selected in the 1H period. A single wordline is selected twice in one vertical period (i.e. one frame period). This is because the two pairs of bitlines BL and/BL are connected with the selective sense amplifier SSA. Therefore, when three or more pairs of bitlines BL and/BL are connected with the selective sense amplifier SSA, a single wordline is selected three or more times in one vertical period.

In the embodiment, the wordline WL is controlled by the wordline control circuit 240 shown in FIG. 4, for example.

3.4 Arrangement of Wordline Control Circuit

Figure 25:
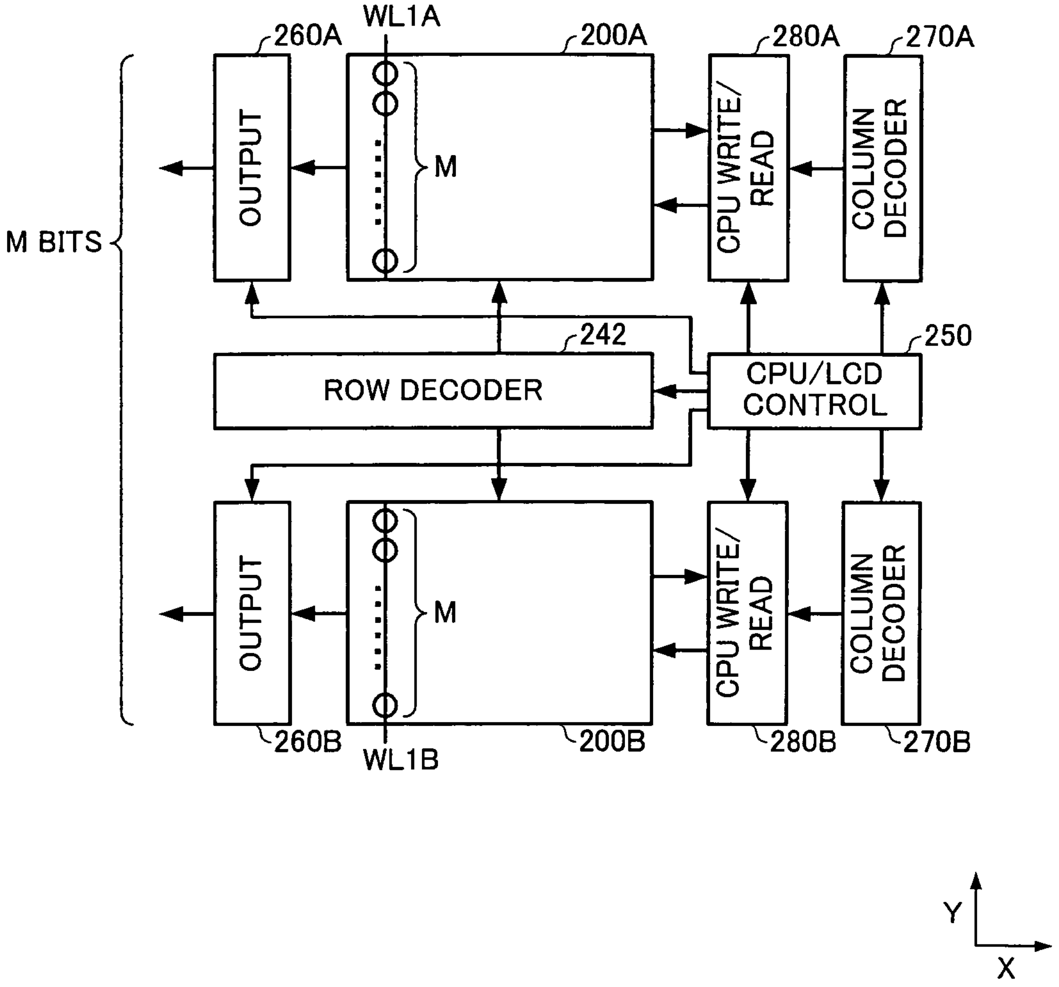
FIG. 25 is a configuration example of the RAM block according to the embodiment.

In the embodiment, when the number of memory cells arranged in the RAM 200 along the direction Y is "M×2", the row decoder (wordline control circuit in a broad sense) 242 may be provided approximately in the middle of the RAM 200 in the direction Y, as shown in FIG. 25.

As shown in FIG. 25, M memory cells MC are arranged in each of the RAMs 200A and 200B along the direction Y, for example. The row decoder 242 controls the wordlines WL of the RAMs 200A and 200B based on signals from the CPU/LCD control circuit 250. The CPU/LCD control circuit 250 controls the row decoder 240, output circuits 260A and 260B, CPU write/read circuits 280A and 280B, and column decoders 270A and 270B based on control performed by an external host, for example.

The CPU write/read circuits 280A and 280B write data from the host into the RAM 200, or read data stored in the RAM 200 and output the read data to the host based on signals from the CPU/LCD control circuit 250. The column decoders 270A and 270B control selection of the bitlines BL and/BL of the RAM 200 based on signals from the CPU/LCD control circuit 250.

The number of memory cells MC arranged in each of the RAMs 200A and 200B along the direction Y is not limited to M. For example, M−a (a is an arbitrary positive integer) memory cells MC may be arranged in the RAM 200A along the direction Y, and M+a memory cells MC may be arranged in the RAM 200B along the direction Y. The number of memory cells MC may be the reverse to that of this example.

Each of the output circuits 260A and 260B includes a plurality of selective sense amplifiers SSA, and outputs M-bit data in total output from the RAM 200A or 200B upon selection of the wordline WL1A or WL1B to the data line driver 100, for example.

In the embodiment, when two pairs of bitlines BL and/BL are connected with the selective sense amplifier SSA, M×2 memory cells are arranged in the RAM 200 along the direction Y, as shown in FIG. 20. In this case, the number of memory cells MC connected with one wordline WL becomes M×2 so that the parasitic capacitance of the wordline WL is increased. As a result, electric power required for the wordline control circuit to select the wordline is increased, whereby a reduction in power consumption is hindered. Moreover, the parasitic capacitance may cause a voltage rise delay to occur when the select voltage is supplied to the wordline so that the read time must be increased in order to stabilize reading from each memory cell MC. As a method for preventing such a problem, a method of reducing the number of memory cells MC connected with one wordline by dividing one wordline into blocks.

However, this method makes it necessary to form the main-wordline MWL and the sub-wordline SWL in the memory cell MC. Moreover, wordline control becomes complicated by dividing the wordline into blocks, and an additional control circuit is required. Specifically, a reduction in design cost and manufacturing cost is hindered.

In the embodiment, the row decoder 242 is provided approximately in the middle of the RAM 200 in the direction Y. Moreover, since the length MCY of the memory cell MC is sufficiently smaller than the length MCX as shown in FIGS. 17B and 18A, the length of the wordline in the direction Y is not increased to a large extent. According to this configuration, power consumption can be reduced without dividing the wordline WL into blocks.

The row decoder 242 controls selection of the wordlines WL of the RAMs 200A and 200B when outputting data to the data line driver 100, and controls selection of the wordline WL of one of the RAMs 200A and 200B when accessed from the host. This further reduces power consumption.

Figures 26A, 26B:
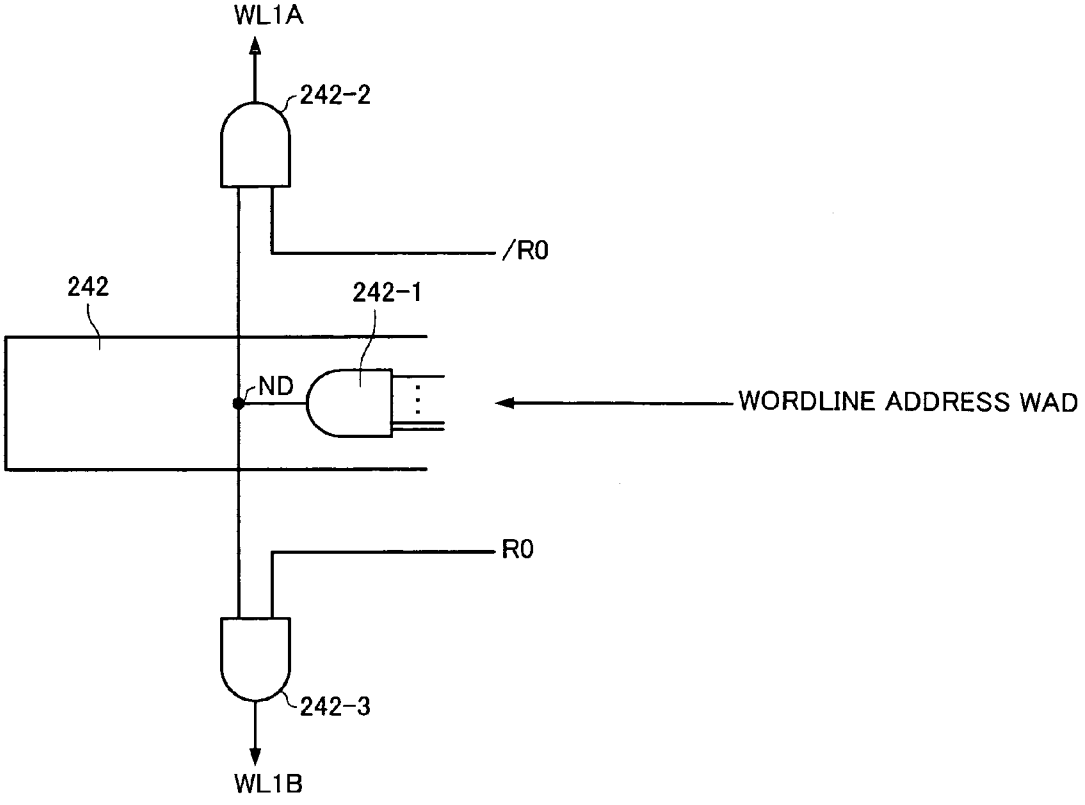
FIGS. 26A and 26B are diagrams illustrative of a wordline control circuit according to the embodiment.

FIGS. 26A and 26B are diagrams illustrative of the above-described control. The row decoder 242 includes a plurality of coincidence detection circuits 242-1, for example. The RAM 200 includes a plurality of AND circuits 242-2 and 242-3. A control signal /R0 is input to the AND circuit 242-2 from the CPU/LCD control circuit 250, for example. A control signal R0 is input to the AND circuit 242-3 from the CPU/LCD control circuit 250, for example. An output of the coincidence detection circuit 242-1 is supplied to the AND circuits 242-2 and 242-3.

The AND circuits 242-2 and 242-3 may be provided in the row decoder 242, or may be provided in the RAMs 200A and 200B.

For example, when the row decoder 242 receives a wordline address WAD designated by the CPU/LCD control circuit 250, one of the coincidence detection circuits 242-1 performs coincidence detection. When the AND of signals input to the coincidence detection circuit 242-1 is logic “1”, the coincidence detection circuit 242-1 detects coincidence. The coincidence detection circuit 242-1 which has detected coincidence outputs a signal at a logic level “1” to a node ND, for example. The signal at a logic level “1” output to the node ND is supplied to the AND circuits 242-2 and 242-3.

As shown in FIG. 26B, the control signals R0 and/R0 are set to be exclusive signals during CPU access (access from the host in a broad sense). In more detail, as shown in FIG. 26B, when the control signal /R0 is set at the H level (or logic level “1”) and the control signal R0 is set at the L level (or logic level “0”), the AND circuit 242-2 outputs a signal at a logic level “1”. As a result, the wordline WL1A of the RAM 200A is selected. Since the control signal R0 is set at the L level, the AND circuit 242-3 outputs a signal at a logic level “0”. Therefore, the wordline WL1B of the RAM 200B is not selected.

When selecting the wordline WL1B of the RAM 200B, the control signals R0 and/R0 are set in a pattern reverse to the above-described pattern, as shown in FIG. 26B.

Since the control signals R0 and/R0 are set at the H level (e.g. logic level “1”) during LCD output in which data is output to the data line driver 100, the wordlines of the RAMs 200A and 200B corresponding to the coincidence detection circuit 242-1 which has detected coincidence are selected.

As described above, since the row decoder 242 selects the wordline of the RAM 200A or 200B when accessed from the host, power consumption can be reduced.

3.5. Arrangement of Column Decoder

Figure 27:
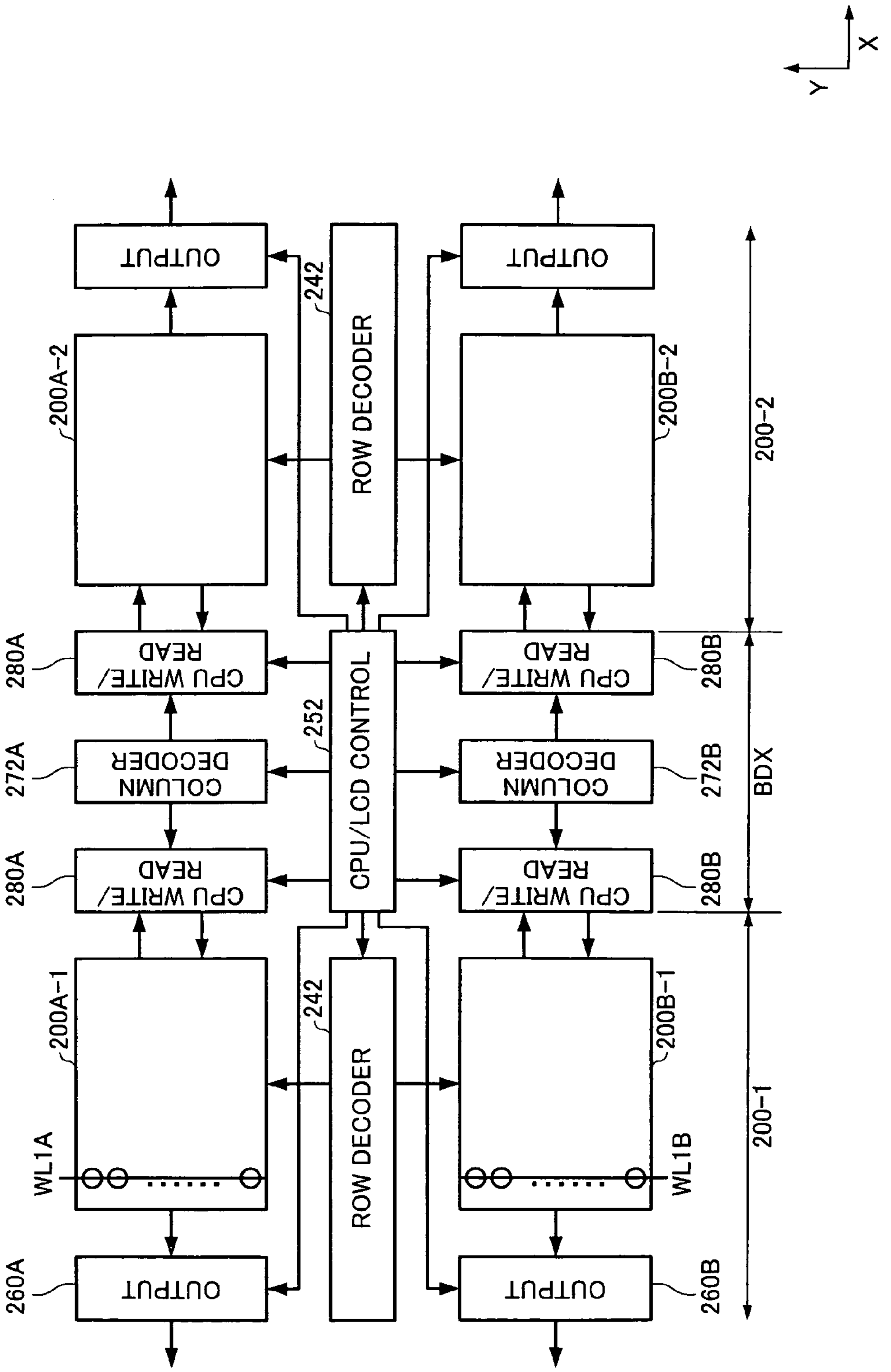
FIG. 27 is another configuration example of the RAM block according to the embodiment.

When the RAM 200 is disposed as shown in FIG. 3A, since a column decoder 272A can be used in common by a RAM 200A-1 of a RAM 200-1 and a RAM 200A-2 of a RAM 200-2 and a column decoder 272B can be used in common by a RAM 200B-1 of the RAM 200-1 and a RAM 200B-2 of the RAM 200-2 as shown in FIG. 27, the number of parts can be reduced, for example. This enables the size of the column decoders in the direction X to be reduced by using the column decoders 272A and 272B shown in FIG. 27 instead of arranging two column decoders 270A and two column decoders 270B shown in FIG. 25 in the direction X.

Moreover, since a CPU/LCD control circuit 252 can be used in common by the RAM 200-1 and the RAM 200-2, the number of parts can be reduced. Therefore, the size of the CPU/LCD control circuit in the direction X can be reduced by using the CPU/LCD control circuit 252 shown in FIG. 27 instead of arranging two CPU/LCD control circuits 250 shown in FIG. 25 in the direction X.

As a result, a width BDX between the RAMs 200-1 and 200-2 in the direction X shown in FIG. 27 can be reduced. This enables the RAM 200 to be efficiently provided in the display driver 20.

4. Modification

Figure 28:
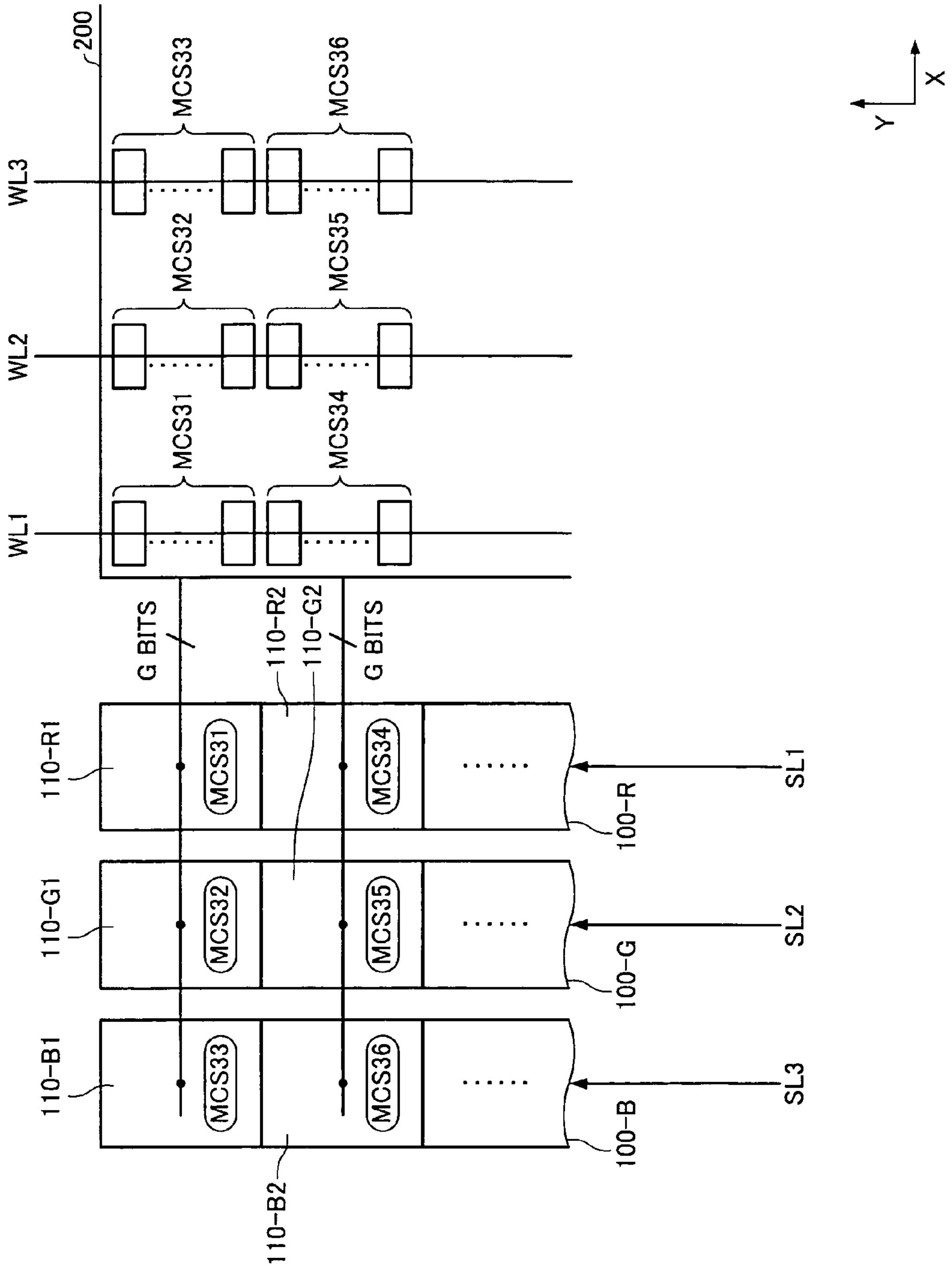
FIG. 28 is a diagram showing a modification according to the embodiment.

FIG. 28 shows a modification according to the embodiment. In FIG. 11A, the data line driver 100 is divided into the data line drivers 100A and 100B in the direction X, for example. The R subpixel data line driver cell, the G subpixel data line driver cell, and the B subpixel data line driver cell are provided in each of the data line drivers 100A and 100B when displaying a color image.

In the modification shown in FIG. 28, the data line driver is divided into three data line drivers 100-R (first divided data line driver group in a broad sense), 100-G (second divided data line driver group in a broad sense), and 100-B (third divided data line driver group in a broad sense) in the direction X. A plurality of R subpixel data line driver cells 110-R1, 110-R2, . . . (R data line driver cells in a broad sense) are provided in the data line driver 100-R along the direction Y, and a plurality of G subpixel data line driver cells 110-G1, 110-G2, . . . (G data line driver cells in a broad sense) are provided in the data line driver 100-G along the direction Y. Likewise, a plurality of B subpixel data line driver cells 110-B1, 110-B2, . . . (B data line driver cells in a broad sense) are provided in the data line driver 100-B along the direction Y.

In the modification shown in FIG. 28, data is read three times (N times in a broad sense; N is a multiple of three) in the 1H period. For example, when the wordline WL1 is selected, the data line driver 100-R latches data output from the RAM 200 in response to the selection of the wordline WL1. This causes data stored in the memory cell group MCS31 to be latched by the data line driver 100-R1, for example.

When the wordline WL2 is selected, the data line driver 100-G latches data output from the RAM 200 in response to the selection of the wordline WL2. This causes data stored in the memory cell group MCS32 to be latched by the data line driver 100-G1, for example.

When the wordline WL3 is selected, the data line driver 100-B latches data output from the RAM 200 in response to the selection of the wordline WL3. This causes data stored in the memory cell group MCS33 to be latched by the data line driver 100-B1, for example.

The above description also applies to the memory cell groups MCS34, MCS35, and MCS36. Data stored in the memory cell groups MCS34, MCS35, and MCS36 is respectively stored in the data line driver cells 110-R2, 110-G2, and 110-B2, as shown in FIG. 28.

Figure 29:
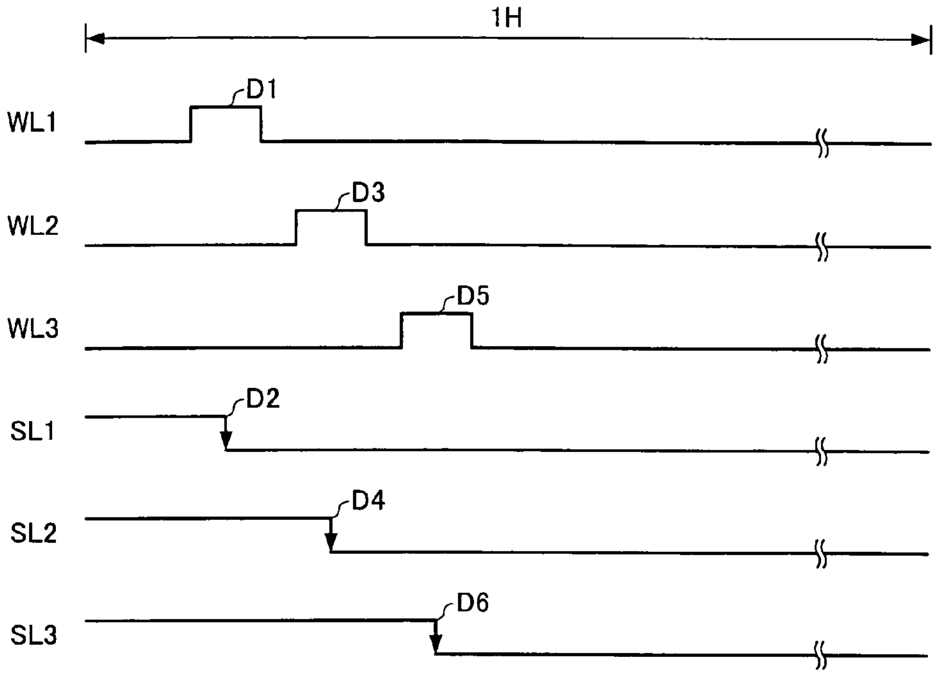
FIG. 29 is a timing chart illustrative of the operation of the modification according to the embodiment.

FIG. 29 is a diagram showing a timing chart of the three-stage read operation. The wordline WL1 is selected at a timing D1 shown in FIG. 29, and the data line driver 100-R latches data from the RAM 200 at a timing D2. This causes data output by the selection of the wordline WL1 to be latched by the data line driver 100-R.

The wordline WL2 is selected at a timing D3, and the data line driver 100-G latches data from the RAM 200 at a timing D4. This causes data output by the selection of the wordline WL2 to be latched by the data line driver 100-G.

The wordline WL3 is selected at a timing D5, and the data line driver 100-B latches data from the RAM 200 at a timing D6. This causes data output by the selection of the wordline WL3 to be latched by the data line driver 100-B.

Figure 30:
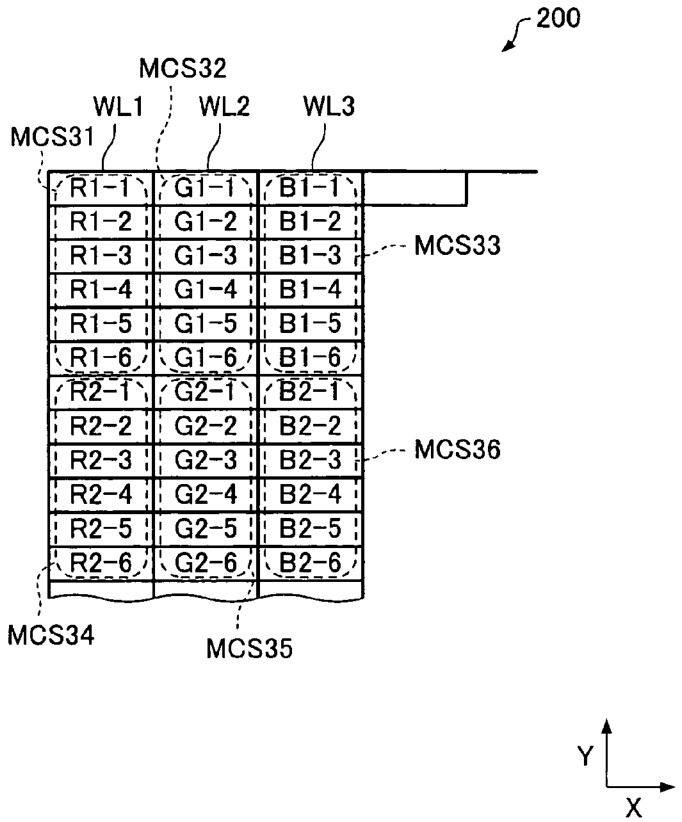
FIG. 30 is an arrangement example of data stored in the RAM block in the modification according to the embodiment.

According to the above-described operation, data is stored in the memory cells MC of the RAM 200 as shown in FIG. 30. For example, data R1-1 shown in FIG. 30 indicates 1-bit data when the R subpixel has a 6-bit grayscale, and is stored in one memory cell MC.

For example, the data R1-1 to R1-6 is stored in the memory cell group MCS31 shown in FIG. 28, the data G1-1 to G1-6 is stored in the memory cell group MCS32, and the data B1-1 to B1-6 is stored in the memory cell group MCS33. Likewise, the data R2-1 to R2-6, G2-1 to G2-6, and B2-1 to B2-6 is respectively stored in the memory cell groups MCS34 to MCS36, as shown in FIG. 30.

For example, the data stored in the memory cell groups MCS31 to MCS33 may be considered to be data for one pixel, and is data for driving the data lines differing from the data lines corresponding to the data stored in the memory cell groups MCS34 to MSC36. Therefore, data in pixel units can be sequentially written into the RAM 200 along the direction Y.

Among the data lines provided in the display panel 10, the data line corresponding to the R subpixel is driven, the data line corresponding to the G subpixel is then driven, and the data line corresponding to the B subpixel is then driven. Therefore, since all the data lines corresponding to the R subpixels have been driven even if a delay occurs in each reading when reading data three times in the 1H period, for example, the area of the region in which an image is not displayed due to the delay is reduced. Therefore, deterioration of display such as a flicker can be reduced.

The modification illustrates the division into three blocks as an example. However, the invention is not limited thereto. When N is the multiple of three, ⅓ of the N divided data line drivers correspond to the first divided data line driver group, other ⅓ of the N divided data line drivers correspond to the second divided data line driver group, and the remaining ⅓ of the N divided data line drivers correspond to the first divided data line driver group.

5. Effect of Embodiment

Figure 31A:
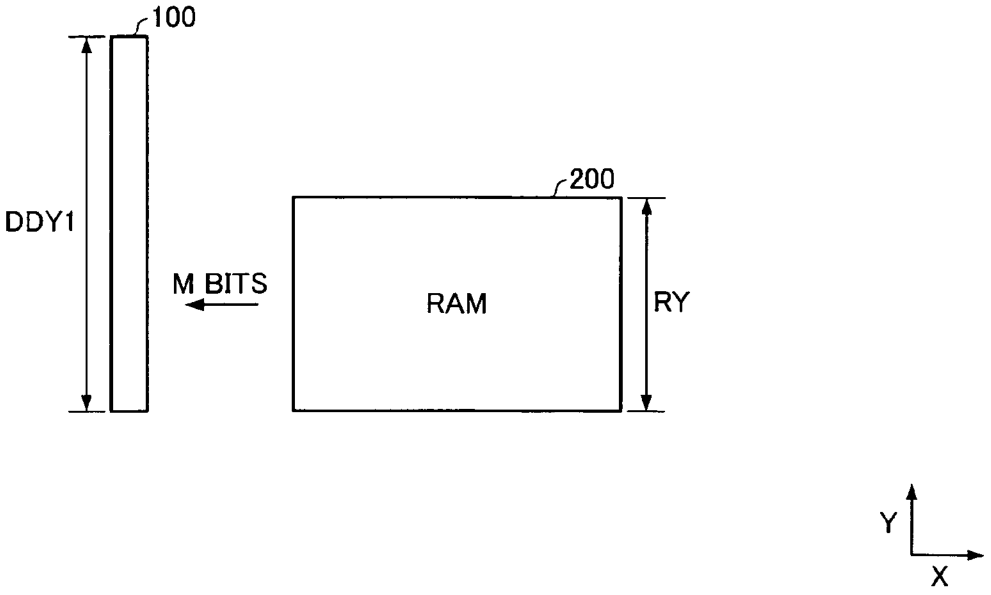
FIGS. 31A and 31B are diagrams illustrative of effects of a data line driver block according to the embodiment.

Suppose that the length of the RAM 200 in the direction Y is set at RY when arranging the RAM 200 in the display driver 20 shown in FIG. 1A. In this case, the RAM 200 outputs M-bit data upon one wordline selection. Suppose that the length of the data line driver 100 in the direction Y is set at DDY1 as shown in FIG. 31A when designing the data line driver 100 to latch M-bit data. In this case, since the length DDY1 of the data line driver 100 is greater than the length RY of the RAM 200, the data line driver 100 cannot be provided within the length ICY shown in FIG. 3A.

If the number of bits is increased accompanying an increase in resolution of the display panel, the length DDY1 of the data line driver 100 is further increased.

Figure 31B:
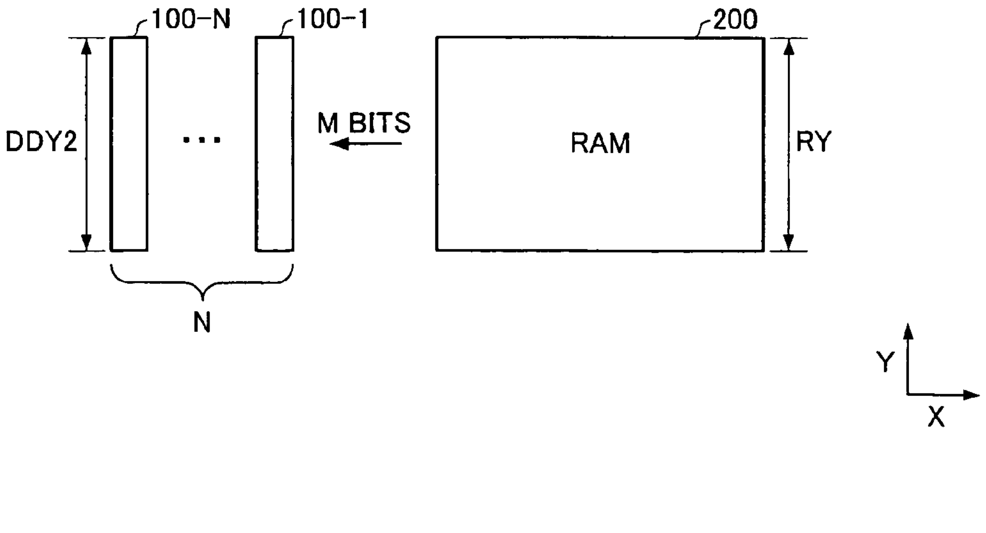

In the embodiment, the data line driver 100 can be divided into N divided data line drivers 100-1 to 100-N as shown in FIG. 31B. This enables the data line driver 100 to be provided within the width ICY of the display driver 20 shown in FIG. 3A, even if the number of bits M is increased. Specifically, since the data line driver 100 can be flexibly arranged, the data line driver 100 can be efficiently provided in the display driver 20 or the like.

In the embodiment, data is read from the RAM 200 a plurality of times in the 1H period, as described above. Therefore, the number of memory cells MC connected with one wordline can be reduced, or the data line driver 100 can be divided. For example, since the number of memory cells MC corresponding to one wordline can be adjusted by changing the number of readings in the 1H period, the length RX in the direction X and the length RY in the direction Y of the RAM 200 can be appropriately adjusted. Moreover, the number of divisions of the data line driver 100 can be changed by adjusting the number of readings in the 1H period.

Moreover, the number of blocks of the data line driver 100 and the RAM 200 can be easily changed or the layout size of the data line driver 100 and the RAM 200 can be easily changed corresponding to the number of data lines provided in the display region 12 of the drive target display panel 10. Therefore, the display driver 20 can be designed while taking other circuits provided to the display driver 20 into consideration, whereby design cost of the display driver 20 can be reduced. For example, when only the number of data lines is changed corresponding to the design change in the drive target display panel 10, the major design change target may be the data line driver 100 and the RAM 200. In this case, since the layout size of the data line driver 100 and the RAM 200 can be flexibly designed in the embodiment, a known library may be used for other circuits. Therefore, the embodiment enables effective utilization of the limited space, whereby design cost of the display driver 20 can be reduced.

In the embodiment, since data is read a plurality of times in the 1H period, M×2 memory cells MC can be provided in the direction Y of the RAM 200 from which M-bit data is output to the sense amplifiers SSA as shown in FIG. 18A. This enables efficient arrangement of the memory cells MC, whereby the chip area can be reduced.

In the display driver 24 of the comparative example shown in FIG. 8, since the wordline WL is very long, a certain amount of electric power is required to prevent a variation due to a data read delay from the RAM 205. Moreover, since the wordline WL is very long, the number of memory cells connected with one wordline WL1 is increased, whereby the parasitic capacitance of the wordline WL is increased. An increase in the parasitic capacitance may be dealt with by dividing the wordlines WL and controlling the divided wordlines. However, this makes it necessary to provide an additional circuit.

In the embodiment, the wordlines WL1 and WL2 and the like are formed to extend along the direction Y as shown in FIG. 11A, and the length of each wordline is sufficiently small in comparison with the wordline WL of the comparative example. Therefore, the amount of electric power required to select the wordline WL1 is reduced. This prevents an increase in power consumption even when reading data a plurality of times in the 1H period.

When the 4BANK RAMs 200 are provided as shown in FIG. 3A, the wordline select signal and the latch signals SLA and SLB are controlled in the RAM 200 as shown in FIG. 11B. These signals may be used in common for each of the 4BANK RAMs 200, for example.

In more detail, the identical data line control signal SLC (data line driver control signal) is supplied to the data line drivers 100-1 to 100-4, and the identical wordline control signal RAC (RAM control signal) is supplied to the RAMs 200-1 to 200-4, as shown in FIG. 10. The data line control signal SLC includes the latch signals SLA and SLB shown in FIG. 11B, and the RAM control signal RAC includes the wordline select signal shown in FIG. 11B, for example.

Therefore, the wordline of the RAM 200 is selected similarly in each BANK, and the latch signals SLA and SLB supplied to the data line driver 100 fall similarly. Specifically, the wordline of one RAM 200 and the wordline of another RAM 200 are selected at the same time in the 1H period. This enables the data line drivers 100 to drive the data lines normally.

In the embodiment, image data for one display frame can be stored in the RAMs 200 provided in the display driver 20, for example. However, the invention is not limited thereto.

The display panel 10 may be provided with k (k is an integer larger than one) display drivers, and 1/k of the image data for one display frame may be stored in each of the k display drivers. In this case, when the total number of data lines DL for one display frame is DLN, the number of data lines driven by each of the k display drivers is DLN/k.

Although only some embodiments of the invention have been described in detail above, those skilled in the art will readily appreciate that many modifications are possible in the embodiments without departing from the novel teachings and advantages of this invention. Accordingly, all such modifications are intended to be included within the scope of this invention. For example, the terms mentioned in the specification or the drawings at least once together with different terms in a broader sense or a similar sense may be replaced with the different terms in any part of the specification or the drawings.

What is claimed is:

1. An integrated circuit device, comprising:

a RAM block including a plurality of wordlines, a plurality of bitlines, a plurality of memory cells, and a wordline control circuit; and a data line driver block which drives a plurality of data line groups of a display panel based on data supplied from the RAM block, the data line driver block including first to Nth (N is an integer larger than one) divided data line driver blocks, each of the first to Nth divided data line driver blocks driving a different data line group of the data line groups, the wordline control circuit driving an identical wordline N times from among the wordlines in one horizontal scan period of the display panel, and the first to Nth divided data line driver blocks being disposed along a first direction in which the bitlines extend.

2. The integrated circuit device as defined in claim 1, including first to Nth latch signals supplied to the first to Nth divided data line driver blocks, respectively, and the first to Nth divided data line driver blocks latching data supplied from the RAM block based on the first to Nth latch signals.

3. The integrated circuit device as defined in claim 2, when the identical wordline is selected first time, the first latch signal is set to active so that data supplied from the RAM block in response to the first selection is latched by the first divided data line driver block, and when the identical wordline is selected Kth time ($1 \leqq K \leqq N$; K is an integer), the Kth latch signal is set to active so that data supplied from the RAM block in response to the Kth selection is latched by the Kth divided data line driver block.

4. The integrated circuit device as defined in claim 2, the RAM block including a sense amplifier circuit which outputs M-bit data (M is an integer larger than one) upon one wordline selection, at least M×N memory cells being arranged in the RAM block along a second direction in which the wordlines extend, and (M×N)-bit data being supplied to the sense amplifier circuit upon one wordline selection.

5. The integrated circuit device as defined in claim 4, the sense amplifier circuit detecting and outputting M-bit data of the (M×N)-bit data based on a sense amplifier select signal.

6. The integrated circuit device as defined in claim 5, the sense amplifier circuit including a plurality of selective sense amplifiers, and each time the identical wordline is selected N times in the one horizontal scan period, each of the selective sense amplifiers receives N-bit data from first to Nth memory cells of M×N memory cells connected with the selected wordline, and detects and outputs 1-bit data from a Kth ($1 \leqq K \leqq N$; K is an integer) memory cell of the first to Nth memory cells based on the sense amplifier select signal.

7. The integrated circuit device as defined in claim 6, the sense amplifier select signal being set so that the selective sense amplifier detects and outputs data received from the first memory cell when the identical wordline is selected first time, and detects and outputs data received from the Kth memory cell when the identical wordline is selected Kth time.

8. The integrated circuit device as defined in claim 4, each of the first to Nth divided data line driver blocks driving one of the data line groups based on the M-bit data supplied from the RAM block, and when a grayscale of a pixel corresponding to a data line is G bits, each of the first to Nth divided data line driver blocks drives M/G data lines.

9. The integrated circuit device as defined in claim 4, each of the first to Nth divided data line driver blocks driving one of the data line groups based on the M-bit data supplied from the RAM block, and when a grayscale of a pixel corresponding to a data line is G bits, each of the first to Nth divided data line driver blocks includes M/G data line driver cells, and wherein each of the M/G data line driver cells drives one of the data lines.

10. The integrated circuit device as defined in claim 9, the value "M/G" being a multiple of three when the display panel performs a color display, the M/G data line driver cells including M/3G R data line driver cells, M/3G G data line driver cells and M/3G B data line driver cells, each of M/3G R data line driver cells driving a data line corresponding to an R pixel, each of M/3G G data line driver cells driving a data line corresponding to a G pixel, and each of M/3G B data line driver cells driving a data line corresponding to a B pixel, and the M/G data line driver cells being arranged so that the R data line driver cells, the G data line driver cells, and the B data line driver cells are alternately disposed.

11. The integrated circuit device as defined in claim 9, the value "N" being a multiple of three when the display panel performs a color display, the M/G data line driver cells in a first group when dividing the first to Nth divided data line driver blocks into three groups including M/G R data line driver cells, each of which drives a data line corresponding to an R pixel, the M/G data line driver cells in a second group including M/G G data line driver cells, each of which drives a data line corresponding to a G pixel, the M/G data line driver cells in a third group including M/G B data line driver cells, each of which drives a data line corresponding to a B pixel, and the M/G data line driver cells being arranged along the second direction.

12. The integrated circuit device as defined in claim 4, each of the first to Nth divided data line driver blocks including first to Sth (S is an integer larger than one) subdivided data line drivers into which the divided data line driver is subdivided, when a grayscale of a pixel corresponding to a data line is G bits, each of the first to Sth subdivided data line drivers includes M/(G×S) data line driver cells, each of which drives one of the data lines, and the first to Sth subdivided data line drivers being disposed along the first direction.

13. The integrated circuit device as defined in claim 12, an identical latch signal of the first to Nth latch signals being supplied to each of the first to Sth subdivided data line drivers.

14. The integrated circuit device as defined in claim 1, the wordlines being formed parallel to a direction in which the data lines of the display panel extend.

15. An electronic instrument, comprising:

the integrated circuit device as defined in claim 1; and a display panel.

16. The electronic instrument as defined in claim 15, the integrated circuit device being mounted on a substrate which forms the display panel.

17. An integrated circuit device, comprising:
a RAM block including a plurality of wordlines, a plurality of bitlines, a plurality of memory cells, and a wordline control circuit; and
a data line driver block which drives a plurality of data line groups of a display panel based on data supplied from the RAM block,
the data line driver block including first to Nth (N is an integer larger than one) divided data line driver blocks, each of the first to Nth divided data line driver blocks driving a different data line group of the data line groups,
the wordline control circuit controlling (L×J=N) times of reading of data from the RAM block in one horizontal scan period of the display panel, by selecting an identical wordline L times (L is an integer larger than one) and J wordlines (J is an integer larger than one) as the identical wordline selected L times in the one horizontal scan period, and
the first to Nth divided data line driver blocks being disposed along a first direction in which the bitlines extend.

18. An integrated circuit device, comprising:
a RAM block including a plurality of wordlines, a plurality of bitlines, a plurality of memory cells, and a wordline control circuit; and
a data line driver block which drives a plurality of data line groups of a display panel based on data supplied from the RAM block,
the data line driver block including first to Nth (N is an integer larger than one) divided data line driver blocks, each of the first to Nth divided data line driver blocks driving a different data line group of the data line groups,
the wordline control circuit sequentially selecting N (N is an integer larger than one) different wordlines in one horizontal scan period of the display panel, and selects an identical wordline at least L times (L is an integer larger than one) in one vertical scan period of the display panel; and
the first to Nth divided data line driver blocks being disposed along a first direction in which the bitlines extend.

19. The integrated circuit device as defined in claim 18,
first to Nth latch signals being supplied to the first to Nth divided data line driver blocks, respectively, and
the first to Nth divided data line driver blocks latching data supplied from the RAM block based on the first to Nth latch signals.

20. The integrated circuit device as defined in claim 19,
when the wordlines are selected first time in the one horizontal scan period, the first latch signal is set to active so that data supplied from the RAM block in response to the first selection is latched by the first divided data line driver block, and, when the wordlines are selected Kth time ($1 \leqq K \leqq N$; K is an integer), the Kth latch signal is set to active so that data supplied from the RAM block in response to the Kth selection is latched by the Kth divided data line driver block.

21. The integrated circuit device as defined in claim 19,
the RAM block including a sense amplifier circuit which outputs M-bit data (M is an integer larger than one) upon one wordline selection,
at least M×L memory cells being arranged in the RAM block along a second direction in which the wordlines extend, and
(M×L)-bit data being supplied to the sense amplifier circuit upon one wordline selection.

22. The integrated circuit device as defined in claim 21,
each of the first to Nth divided data line driver blocks drives one of the data line groups based on the M-bit data supplied from the RAM block, and
when a grayscale of a pixel corresponding to a data line is G bits, each of the first to Nth divided data line driver blocks includes M/G data line driver cells, and
each of the M/G data line driver cells drives one of the data lines.

23. The integrated circuit device as defined in claim 22,
the value "M/G" being a multiple of three when the display panel performs a color display,
the M/G data line driver cells including M/3G R data line driver cells, M/3G G data line driver cells and M/3G B data line driver cells, each of M/3G R data line driver cells driving a data line corresponding to an R pixel, each of M/3G G data line driver cells driving a data line corresponding to a G pixel, and each of M/3G B data line driver cells driving a data line corresponding to a B pixel, and
the M/G data line driver cells being arranged so that the R data line driver cells, the G data line driver cells, and the B data line driver cells are alternately disposed.

24. The integrated circuit device as defined in claim 22,
the value "N" being a multiple of three when the display panel performs a color display,
the M/G data line driver cells in a first group when dividing the first to Nth divided data line driver blocks into three groups including M/G R data line driver cells, each of which drives a data line corresponding to an R pixel,
the M/G data line driver cells in a second group including M/G G data line driver cells, each of which drives a data line corresponding to a G pixel,
the M/G data line driver cells in a third group including M/G B data line driver cells, each of which drives a data line corresponding to a B pixel, and
the M/G data line driver cells being arranged along the second direction.

25. The integrated circuit device as defined in claim 21,
each of the first to Nth divided data line driver blocks including first to Sth (S is an integer larger than one) subdivided data line drivers into which the divided data line driver is subdivided,
when a grayscale of a pixel corresponding to a data line is G bits, each of the first to Sth subdivided data line drivers includes M/(G×S) data line driver cells, each of which drives one of the data lines, and
the first to Sth subdivided data line drivers being disposed along the first direction.

26. The integrated circuit device as defined in claim 25,
an identical latch signal of the first to Nth latch signals being supplied to each of the first to Sth subdivided data line drivers.

* * * * *